US012563694B2

(12) United States Patent
Narayanan et al.

(10) Patent No.: US 12,563,694 B2
(45) Date of Patent: Feb. 24, 2026

(54) CONFIGURABLE AIRFLOW DIRECTION FAN SYSTEM

(71) Applicant: Dell Products L.P., Round Rock, TX (US)

(72) Inventors: Padmanabhan Narayanan, Chennai (IN); Shree Rathinasamy, Round Rock, TX (US); Vamshidhar Varre, Hyderabad (IN); Neal Beard, Austin, TX (US); Elayarajan Kannan, Chennai (IN); Per Henrik Fremrot, Novato, CA (US)

(73) Assignee: Dell Products L.P., Round Rock, TX (US)

( * ) Notice: Subject to any disclaimer, the term of this patent is extended or adjusted under 35 U.S.C. 154(b) by 352 days.

(21) Appl. No.: 18/479,235

(22) Filed: Oct. 2, 2023

(65) Prior Publication Data

US 2025/0113462 A1 Apr. 3, 2025

(51) Int. Cl.
*H05K 7/20* (2006.01)
*F04D 27/00* (2006.01)

(52) U.S. Cl.
CPC ......... *H05K 7/20172* (2013.01); *F04D 27/00* (2013.01)

(58) Field of Classification Search
CPC .......... H05K 7/20172; H05K 7/20145; H05K 7/20581; H05K 7/20136; H05K 7/2019; H05K 7/20209; H05K 7/20718; G06F 1/20; G06F 1/183; G06F 1/206; G06F 1/181; F04D 19/007; F04D 25/166; F04D 19/002; F04D 19/005; F04D 29/646; F04D 29/703; F04D 27/00; H01L 2224/49171
See application file for complete search history.

(56) References Cited

U.S. PATENT DOCUMENTS

| | | | | |
|---|---|---|---|---|
| 6,042,474 A * | 3/2000 | Harvey | ...................... | G06F 1/20 |
| | | | | 415/182.1 |
| 6,362,960 B1 * | 3/2002 | Ducourt | ............. | H05K 7/20172 |
| | | | | 361/695 |
| 6,999,313 B2 * | 2/2006 | Shih | ................... | H05K 7/20172 |
| | | | | 165/104.33 |
| 7,558,061 B2 * | 7/2009 | Franz | .................... | F04D 29/646 |
| | | | | 415/213.1 |

(Continued)

OTHER PUBLICATIONS

Mizuno et al., Fan Unit for Electronic Equipment, Jul. 31, 1997, PE2E search translation (Year: 1997).*

*Primary Examiner* — Michael A Matey
(74) *Attorney, Agent, or Firm* — Joseph Mencher

(57) ABSTRACT

A configurable airflow direction fan system includes a fan device with a fan chassis connector, and a fan chassis that connects to a computing device. A first airflow direction fan device connector on the fan chassis connects to the fan chassis connector on the fan device when the fan device is mounted to the fan chassis in a first airflow direction orientation that will produce a first direction airflow in the computing device when the fan chassis is positioned in the computing device. A second airflow direction fan device connector on the fan chassis connects to the fan chassis connector on the fan device when the fan device is mounted to the fan chassis in the second airflow direction orientation that will produce a second direction airflow in the computing device that is different than the first direction airflow when the fan chassis is positioned in the computing device.

20 Claims, 28 Drawing Sheets

(56)                    References Cited

U.S. PATENT DOCUMENTS

| | | | | |
|---|---|---|---|---|
| 7,580,260 | B2 * | 8/2009 | Figuerado | H05K 7/20172 |
| | | | | 415/126 |
| 7,623,343 | B2 * | 11/2009 | Chen | G06F 1/186 |
| | | | | 361/679.4 |
| 7,643,281 | B2 * | 1/2010 | Okamoto | G11B 33/126 |
| | | | | 361/679.48 |
| 7,722,359 | B1 * | 5/2010 | Frangioso, Jr. | H05K 7/1445 |
| | | | | 361/679.48 |
| 8,068,340 | B1 * | 11/2011 | Nguyen | H05K 7/20172 |
| | | | | 174/547 |
| 11,019,748 | B2 * | 5/2021 | Avvaru | H05K 7/1489 |
| 11,334,127 | B2 * | 5/2022 | Huang | H05K 7/20145 |
| 2013/0100613 | A1 * | 4/2013 | Nakai | H05K 7/20563 |
| | | | | 415/213.1 |
| 2014/0211418 | A1 * | 7/2014 | Arreola | H05K 7/20172 |
| | | | | 361/695 |
| 2014/0364048 | A1 * | 12/2014 | Milligan | H05K 7/20581 |
| | | | | 454/184 |
| 2016/0369815 | A1 * | 12/2016 | Wilcox | F04D 29/522 |
| 2017/0086332 | A1 * | 3/2017 | Jaskela | H05K 7/1487 |
| 2019/0069442 | A1 * | 2/2019 | Pav | G06F 1/20 |
| 2021/0282296 | A1 * | 9/2021 | Shabtay | H01R 25/006 |
| 2023/0112501 | A1 * | 4/2023 | Karuppiah | H05K 7/20727 |
| | | | | 702/22 |
| 2023/0232592 | A1 * | 7/2023 | Killen, Jr. | G06F 1/20 |
| | | | | 361/679.33 |
| 2024/0102491 | A1 * | 3/2024 | Chen | F04D 29/522 |
| 2025/0059984 | A1 * | 2/2025 | Chen | F04D 29/644 |

* cited by examiner

302

FAN CHASSIS 300

FORWARD AIRFLOW DIRECTION FAN DEVICE CONNECTOR 310a

REVERSE AIRFLOW DIRECTION FAN DEVICE CONNECTOR 310b

MUX DEVICE 308

EEPROM DEVICE 306

COMPUTING DEVICE CONNECTOR 304

500

FAN DEVICE MOUNTED IN FAN CHASSIS IN 1ST AIRFLOW DIRECTION ORIENTATION
502

FAN CHASSIS CONNECTED TO COMPUTING DEVICE
504

COMPUTING DEVICE CONTROLS FAN DEVICE TO PRODUCE AIRFLOW IN 1ST DIRECTION
506

AIRFLOW DIRECTION CHANGE REQUIRED IN COMPUTING DEVICE?
508

N

Y

FAN DEVICE MOUNTED IN FAN CHASSIS IN 2ND AIRFLOW DIRECTION ORIENTATION
510

FAN CHASSIS CONNECTED TO COMPUTING DEVICE
512

COMPUTING DEVICE CONTROLS FAN DEVICE TO PRODUCE AIRFLOW IN 2ND DIRECTION
514

FIG. 5

CONFIGURABLE AIRFLOW DIRECTION FAN SYSTEM

BACKGROUND

The present disclosure relates generally to information handling systems, and more particularly to a fan system with a configurable airflow direction for use with information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as switch devices, server devices, and/or other computing devices known in the art, often include one or more fan systems for use in cooling the computing device and/or its components. Furthermore, those computing devices may be configured to be positioned in racks that may be provided (e.g., in a datacenter) with a "cold" side via which air is provided for cooling the computing devices, and a "hot" side via which the computing devices exhaust air that has been used to cool those computing devices. However, some computing devices may be provided in a rack in multiple orientations (e.g., Top Of Rack (TOR) switch devices are often oriented differently that leaf switch devices and spine switch devices) that may position those computing devices such that they either face the "cold" side of the rack or the "hot" side of the rack, and one of skill in the art will recognize how the orientation of a computing device in a rack will dictate the configuration of its fan systems, as those fan systems should be configured to draw air from the "cold" side of the rack and exhaust that air out of the "hot" side of the rack in order to allow the computing device and its fan systems to operate efficiently.

Conventionally, such issues may be dealt with by determining how a computing device will be oriented in a rack prior to its deployment, and then ordering that computing device (e.g., from its computing device manufacturer) with fan systems that are configured to provide an airflow direction for that computing device/rack orientation. However, such solutions require users to pre-determine the orientation of their computing devices in rack, "lock" the computing device and/or its fan systems to efficient operation only in that orientation, require the computing device manufacturer to stock each of the different airflow direction fan systems for all of its computing devices, and are subject to other deficiencies that would be apparent to one of skill in the art.

While some "reversible" fan systems are available that allow the direction of rotation of the fan in that fan system to be reversed in order to change the airflow direction of that fan system, those fan systems cannot provide the airflow levels required by many computing devices when their airflow direction is reversed. For example, some computing devices require 25000 Rotations Per Minute (RPM) or more from their fan systems, and the aerodynamic configuration of the fan blades on the fans of the "reversible" fan systems discussed above prevents those fan systems from achieving such airflow levels in at least one of the airflow directions.

Accordingly, it would be desirable to provide a configurable airflow direction fan system that addresses the issues discussed above.

SUMMARY

According to one embodiment, a fan chassis includes a computing device connector that is configured to connect to a computing device when the fan chassis is positioned in the computing device; a fan device mounting subsystem that is configured to mount a fan device to the fan chassis in either: a first airflow direction orientation that orients the fan device to produce a first airflow in a first direction in the computing device when the fan chassis is positioned in the computing device; or a second airflow direction orientation that orients the fan device to produce a second airflow in a second direction in the computing device that is different than the first direction when the fan chassis is positioned in the computing device; a first airflow direction fan device connector that is coupled to the computing device connector and that is configured to connect to a fan chassis connector on the fan device when the fan device is mounted to the fan chassis in the first airflow direction orientation; and a second airflow direction fan device connector that is coupled to the computing device connector and that is configured to connect to the fan chassis connector on the fan device when the fan device is mounted to the fan chassis in the second airflow direction orientation.

BRIEF DESCRIPTION OF THE DRAWINGS

FIG. 5 is a flow chart illustrating an embodiment of a method for configuring an airflow direction of a fan system.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
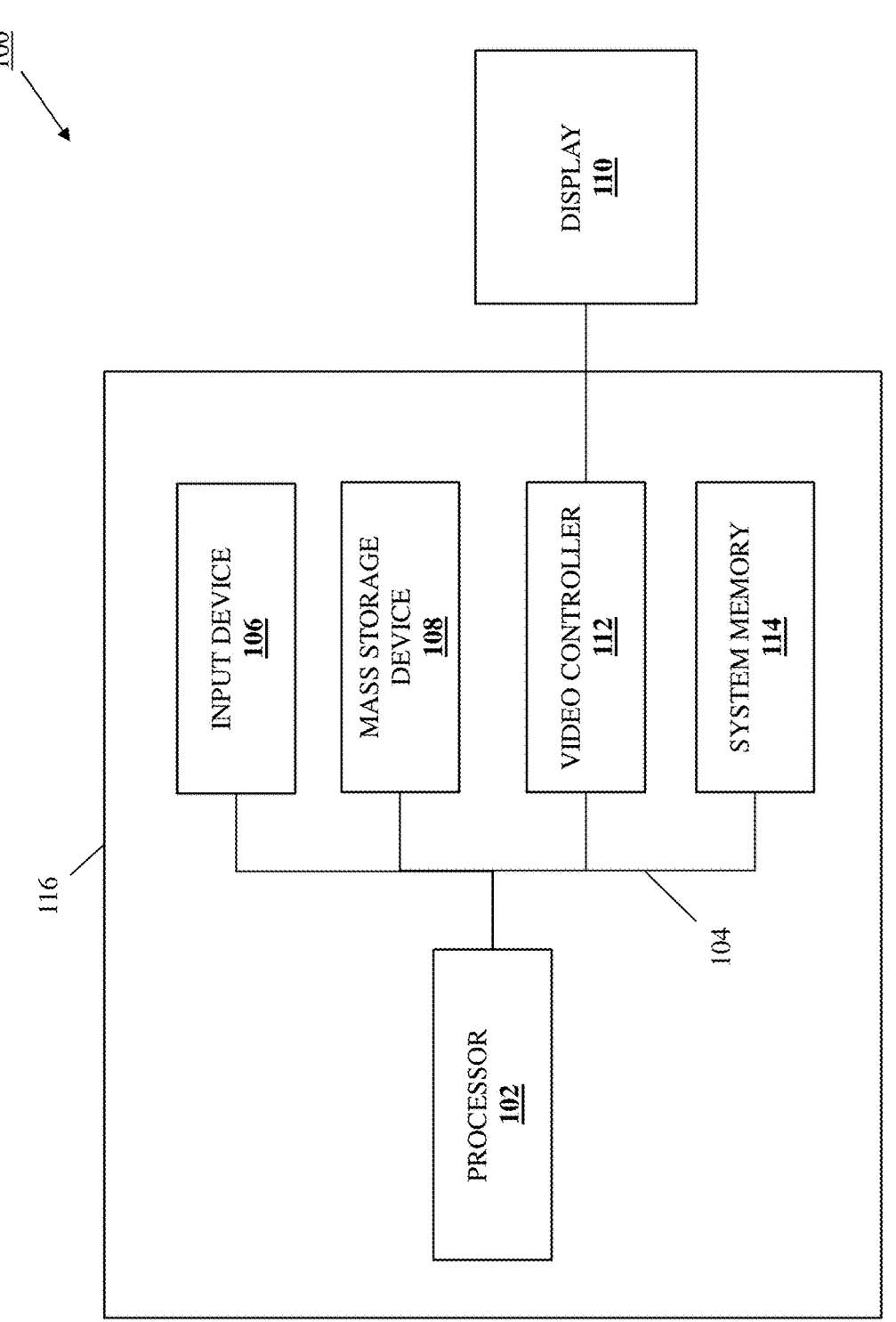
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
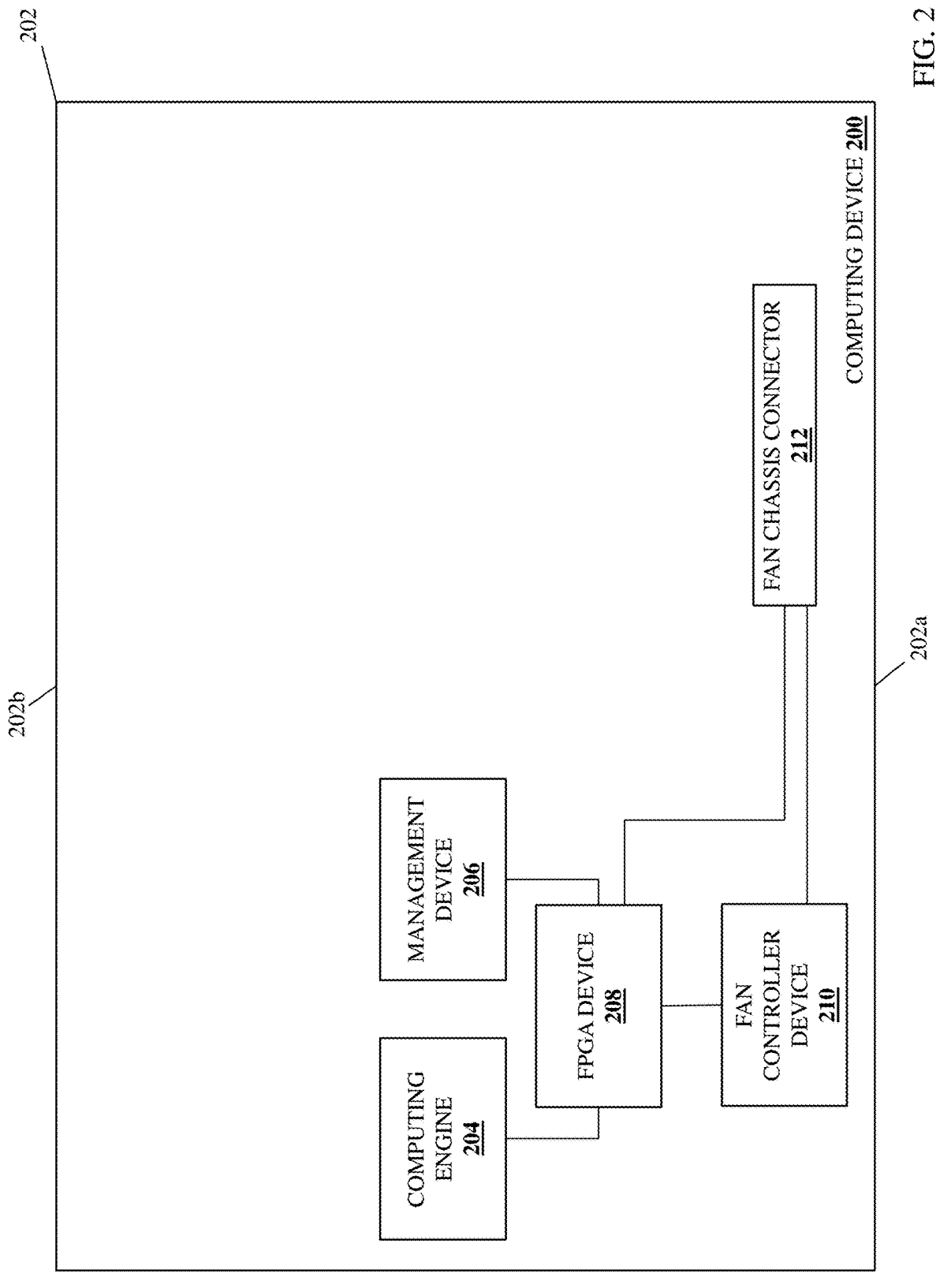
FIG. 2 is a schematic view illustrating an embodiment of a computing device that may provide the configurable airflow direction fan system of the present disclosure.

Referring now to FIG. 2, an embodiment of a computing device 200 is illustrated that may provide the configurable airflow direction fan system of the present disclosure. In an embodiment, the computing device 200 may be provided by the IHS 100 discussed above with reference to FIG. 1 and/or may include some or all of the components of the IHS 100, and in specific examples may be provided by a switch device. However, while illustrated and discussed as being provided by a switch device, one of skill in the art in possession of the present disclosure will recognize that the functionality of the computing device 200 discussed below may be provided by server devices and/or other computing devices that are configured to operate similarly as the computing device 200 discussed below.

In the illustrated embodiment, the computing device 200 includes a chassis 202 that houses the components of the computing device 200, only some of which are illustrated and discussed below, with the chassis 202 including a front surface 202a, and a rear surface 202b that is located opposite the chassis 202 from the front surface 202a. For example, the chassis 202 may house a circuit board that supports a primary processing system (not illustrated, but which may include the processor 102 discussed above with reference to FIG. 1 such as, for example, a Central Processing Unit (CPU), a Network Processing Unit (NPU), and/or other "host" processor that is configured to provide an operating system such as a network operating system for a switch device) and a primary memory system (not illustrated, but which may include the memory 114 discussed above with reference to FIG. 1) that is coupled to the primary processing system and that includes instructions that, when executed by the primary processing system, cause the primary processing system to provide a computing engine 204 that is configured to perform the functionality of the computing engines and/or computing devices discussed below.

In the illustrated embodiment, the circuit board housed in the chassis 202 may also support a management device 206 that may be provided by a Baseboard Management Controller (BMC) device such as the integrated DELL® Remote Access Controller (iDRAC) device available in computing device provided by DELL® Inc. of Round Rock, Texas, United States and/or other BMC devices that would be apparent to one of skill in the art in possession of the present disclosure. The management device 206 may include a management processing system (not illustrated, but which may be similar to the processor 102 discussed above with reference to FIG. 1) and a management memory system (not illustrated, but which may be similar to the memory 114 discussed above with reference to FIG. 1) that is coupled to the management processing system and that includes instructions that, when executed by the management processing system, cause the management processing system to provide a management engine that is configured to perform the functionality of the management engines and/or management devices discussed below.

The circuit board housed in the chassis 202 may also support a Field Programmable Gate Array (FPGA) device 208 that is coupled to the computing engine 204 (e.g., via a coupling such as a Peripheral Component Interconnect express (PCIe) coupling (e.g., trace(s) on the circuit board) between the FPGA device 208 and the primary processing system) and to the management engine device via a coupling such as a PCIe coupling (e.g., trace(s) on the circuit board). The circuit board housed in the chassis 202 may also support a fan controller device 210 that is coupled to the FPGA device 208 (e.g., via trace(s) on the circuit board). The circuit board housed in the chassis 202 may also support a fan chassis connector 212 (e.g., a fan chassis socket included on a circuit board in the computing device 200) that is coupled to the FPGA device 208 via one or more couplings (e.g., trace(s) on the circuit board) such as a Serial CLock (SCL) signal coupling, a Serial DAta (SDA) signal coupling, a power (Vcc) coupling, a Ground (GND) coupling, an airflow detect signal coupling, a fan chassis presence signal coupling, and/or other couplings that one of skill in the art in possession of the present disclosure would recognize as providing the functionality described below.

As will be appreciated by one of skill in the art in possession of the present disclosure, the embodiment of FIG. 2 discussed below illustrated an example of a single fan "bay" located adjacent the fan chassis connector 212 in the computing device 200, and computing devices may include multiple fan "bays" and corresponding fan chassis connectors while remaining within the scope of the present disclosure. For example, many switch devices utilize between 3-7 fan systems, and thus may include 3-7 of the fan bay/fan chassis connector 212 combinations illustrated in FIG. 2. Furthermore, while a specific computing device 200 has been illustrated and described, one of skill in the art in possession of the present disclosure will recognize that computing devices (or other devices operating according to the teachings of the present disclosure in a manner similar to that described below for the computing device 200) may include a variety of components and/or component configurations for providing conventional computing device functionality, as well as the configurable airflow direction fan functionality discussed below, while remaining within the scope of the present disclosure as well.

Figure 3A:
FIG. 3A is a schematic view illustrating an embodiment of a fan chassis that may provide the configurable airflow direction fan system of the present disclosure.
Figure 3B:
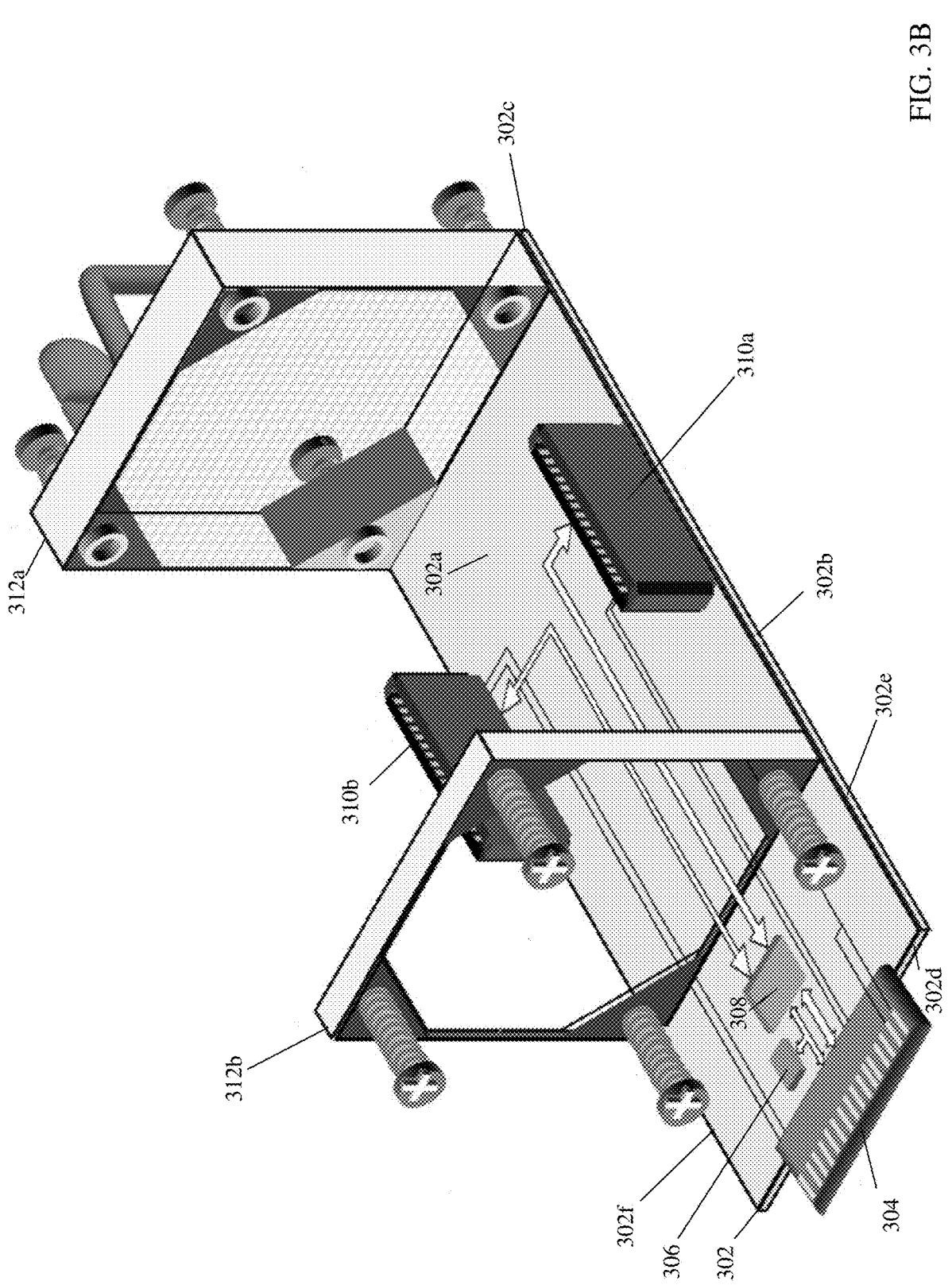
FIG. 3B is a perspective via illustrating an embodiment of the fan chassis of FIG. 3A.

Referring now to FIGS. 3A and 3B, an embodiment of a fan chassis 300 is illustrated that may provide the configurable airflow direction fan system of the present disclosure. As described below, the fan chassis 300 may be provided in the IHS 100 discussed above with reference to FIG. 1 as one of the components of the IHS 100. In the illustrated embodiment, the fan chassis 300 includes a base 302 (e.g., a circuit board and/or other structural components that would be apparent to one of skill in the art in possession of the present disclosure) that supports the components of the fan chassis 300, only some of which are illustrated and described below. In embodiment illustrated in FIG. 3B, the base 302 include a top surface 302a, a bottom surface 302b that is located opposite the base 302 from the top surface 302a, a front surface 302c that extends between the top surface 302a and the bottom surface 302b, a rear surface 302d that is located opposite the base 302 from the front surface 302c and that extends between the top surface 302a and the bottom surface 302b, and a pair of side surface 302e and 302f that are located opposite the base 302 from each other and that extend between the top surface 302a, the bottom surface 302b, the front surface 302c, and the rear surface 302d. While not illustrated or described in detail, one of skill in the art in possession of the present disclosure will appreciate how the base 302 may include mounting and/or securing features that allow the fan chassis 300 to be positioned in the computing device 200 discussed above with reference to FIG. 2, as discussed in further detail below.

As illustrated, a computing device connector 304 may be provided on the top surface 302a of the base 302 such that it extends past the rear surface 302d, and as discussed below the computing device connector 304 may be configured to connect to the fan chassis connector 212 on the computing device 200 discussed above with reference to FIG. 2. A memory device such as an Electronically Erasable Programmable Read-Only Memory (EEPROM) device 306 may also be located on the top surface 302a of the base 302 and may be coupled to the computing device connector 304 via one or more couplings (e.g., as part of an Inter-Integrated Circuit (I2C) bus provided by trace(s) on the circuit board that provides the base 302) such as an SCL signal coupling, an SDA signal coupling, a Vcc coupling, a GND coupling, and/or other couplings that one of skill in the art in possession of the present disclosure would recognize as providing the functionality described below.

As discussed in further detail below, the EEPROM device 306 may store an identifier for the fan chassis 300 (e.g., a Stock Keeping Unit (SKU) for the fan chassis 300 that identifies its manufacturer), the configurable airflow direction fan capabilities of the fan chassis 300, and/or any other information that would be apparent to one of skill in the art in possession of the present disclosure. Furthermore, while not described in detail below, the EEPROM device 306 may also be programmed to prevent unauthorized fan devices from being used with the fan chassis 300 in the manner described for the fan devices discussed below. Further still, while fan chassis 300 is illustrated and described as including the EEPROM device 306, the functionality of the EEPROM device 306 described below may instead be provided by an EEPROM device in a fan device used with the fan chassis 300 while remaining within the scope of the present disclosure as well, allowing a smaller computing device connector 304 to be provided on the fan chassis 300, as well as other benefits that would be apparent to one of skill in the art in possession of the present disclosure.

A multiplexer device 308 may also be located on the top surface 302a of the base 302 and may be coupled to the computing device connector 304 and the EEPROM device 306 via one or more couplings (e.g., trace(s) on the circuit board that provides the base 302) such as an SCL signal coupling, an SDA signal coupling, and/or other couplings that one of skill in the art in possession of the present disclosure would recognize as providing the functionality described below, while also being coupled to the computing device connector 304 via one or more couplings (e.g., trace(s) on the circuit board that provides the base 302) such as an ENable (EN) signal coupling, a SELect (SEL) signal coupling, and/or other couplings that one of skill in the art in possession of the present disclosure would recognize as providing the functionality described below. In the specific examples provided below, the multiplexer device 308 is provided by a 2:1 multiplexer, although other multiplexers are envisioned as falling within the scope of the present disclosure as well.

In the illustrated embodiment, a forward airflow direction fan device connector 310a (e.g., socket connector in the specific example provided in FIG. 3B) is located on the top surface 302a of the base 302 adjacent the side surface 302e of the base 302, and may be coupled to the multiplexer device 308 via one or more couplings (e.g., I2C connections provided by trace(s) on the circuit board that provides the base 302) such as an SCL signal coupling, an SDA signal coupling, a Pulse Width Modulation (PWM) signal coupling, a TACHometer (TACH) signal coupling, a Vcc coupling, a GND coupling, and/or other couplings that one of skill in the art in possession of the present disclosure would recognize as providing the functionality described below, while also being coupled to the computing device connector 304 via one or more couplings (e.g., trace(s) on the circuit board that provides the base 302) such as a forward airflow detect coupling, and/or other couplings that one of skill in the art in possession of the present disclosure would recognize as providing the functionality described below.

In the illustrated embodiment, a reverse airflow direction fan device connector 310b (e.g., socket connector in the specific example provided in FIG. 3B) is located on the top surface 302a of the base 302 adjacent the side surface 302f of the base 302, and may be coupled to the multiplexer device 308 via one or more couplings (e.g., I2C connections provided by trace(s) on the circuit board that provides the base 302) such as an SCL signal coupling, an SDA signal coupling, a PWM signal coupling, a TACH signal coupling, a Vcc coupling, a GND coupling, and/or other couplings that one of skill in the art in possession of the present disclosure would recognize as providing the functionality described below, while also being coupled to the computing device connector 304 via one or more couplings (e.g., trace(s) on the circuit board that provides the base 302) such as a reverse airflow detect coupling, and/or other couplings that one of skill in the art in possession of the present disclosure would recognize as providing the functionality described below. In an embodiment, the forward airflow direction fan device connector 310a and the reverse airflow direction fan device connector 310b may each include a plurality of connector elements (also referred to as "pins") that are configured to connect to corresponding connectors on the fan devices as discussed below, and the connector elements/pins on the reverse airflow direction fan device connector 310b may be reversed relative to the connector elements/pins on the forward airflow direction fan device connector 310a.

As illustrated in FIG. 3B, a fan device mounting subsystem may be provided on the base 302 and, in the specific examples provided below include fan mounting elements 312a and 312b that extend from the base 302 in a spaced-apart orientation (e.g., with the fan mounting element 312a located immediately adjacent the front surface 302c of the base 302, and the fan mounting element 312b located opposite the forward airflow direction fan device connector 310a and the reverse airflow direction fan device connector 310b from the fan mounting element 312a). As will be appreciated by one of skill in the art in possession of the present disclosure, the fan mounting elements 312a and 312b may include mounting elements such as the captive screws illustrated in FIG. 3B and discussed below that are configured to secure a fan device to the fan chassis 300, while the fan mounting element 312a may include a handle, a securing element, and/or other features that allow a user to handle the fan chassis 300, secure the fan chassis 300 in the computing device 200 discussed above with reference to FIG. 2, and/or provide any of the other functionality described below. However, while a specific fan chassis 300 has been illustrated and described, one of skill in the art in possession of the present disclosure will recognize that fan chassis (or other devices operating according to the teachings of the present disclosure in a manner similar to that described below for the fan chassis 300) may include a variety of components and/or component configurations for providing conventional fan chassis functionality, as well as the configurable airflow direction fan functionality discussed below, while remaining within the scope of the present disclosure as well.

Figure 4A:
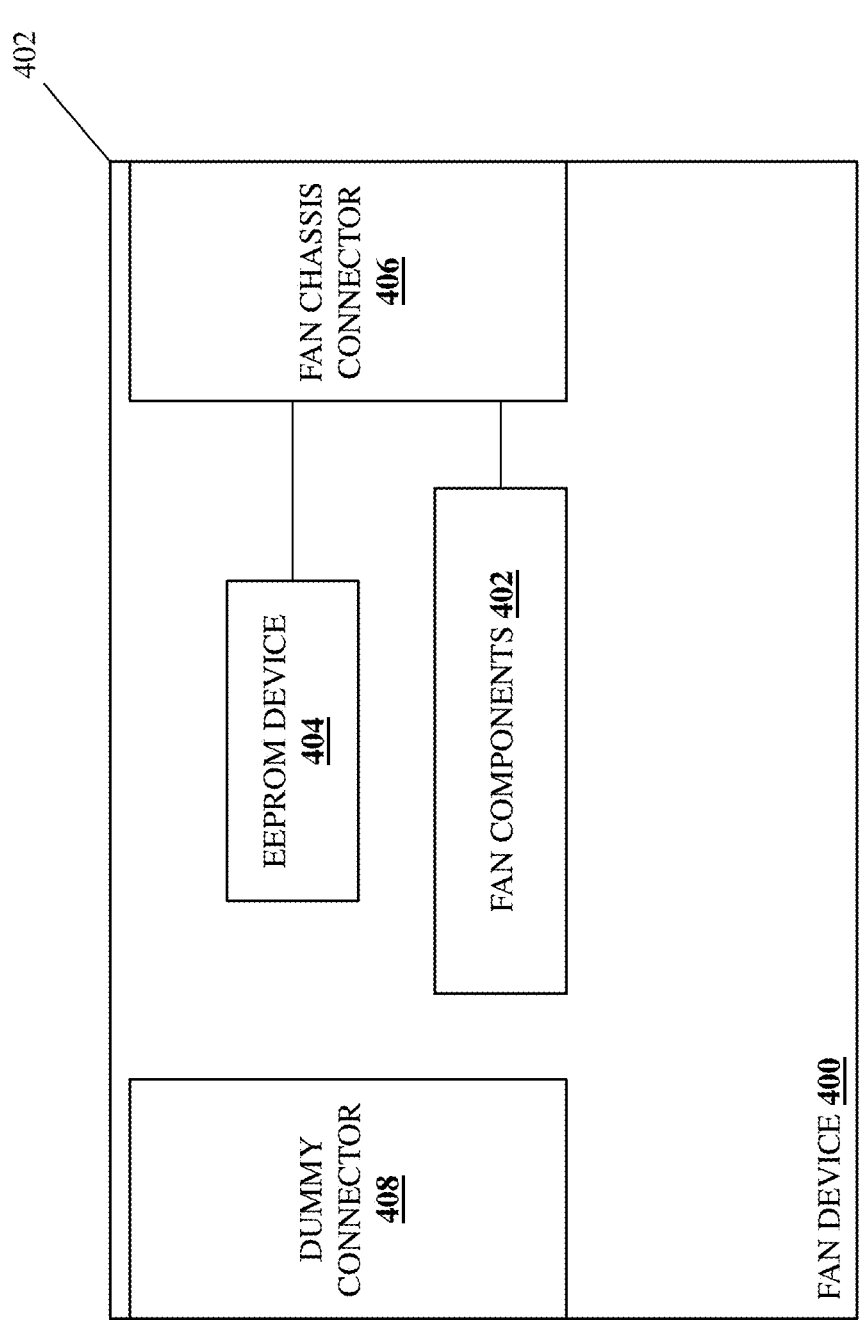
FIG. 4A is a schematic view illustrating an embodiment of a fan device that may provide the configurable airflow direction fan system of the present disclosure.
Figure 4B:
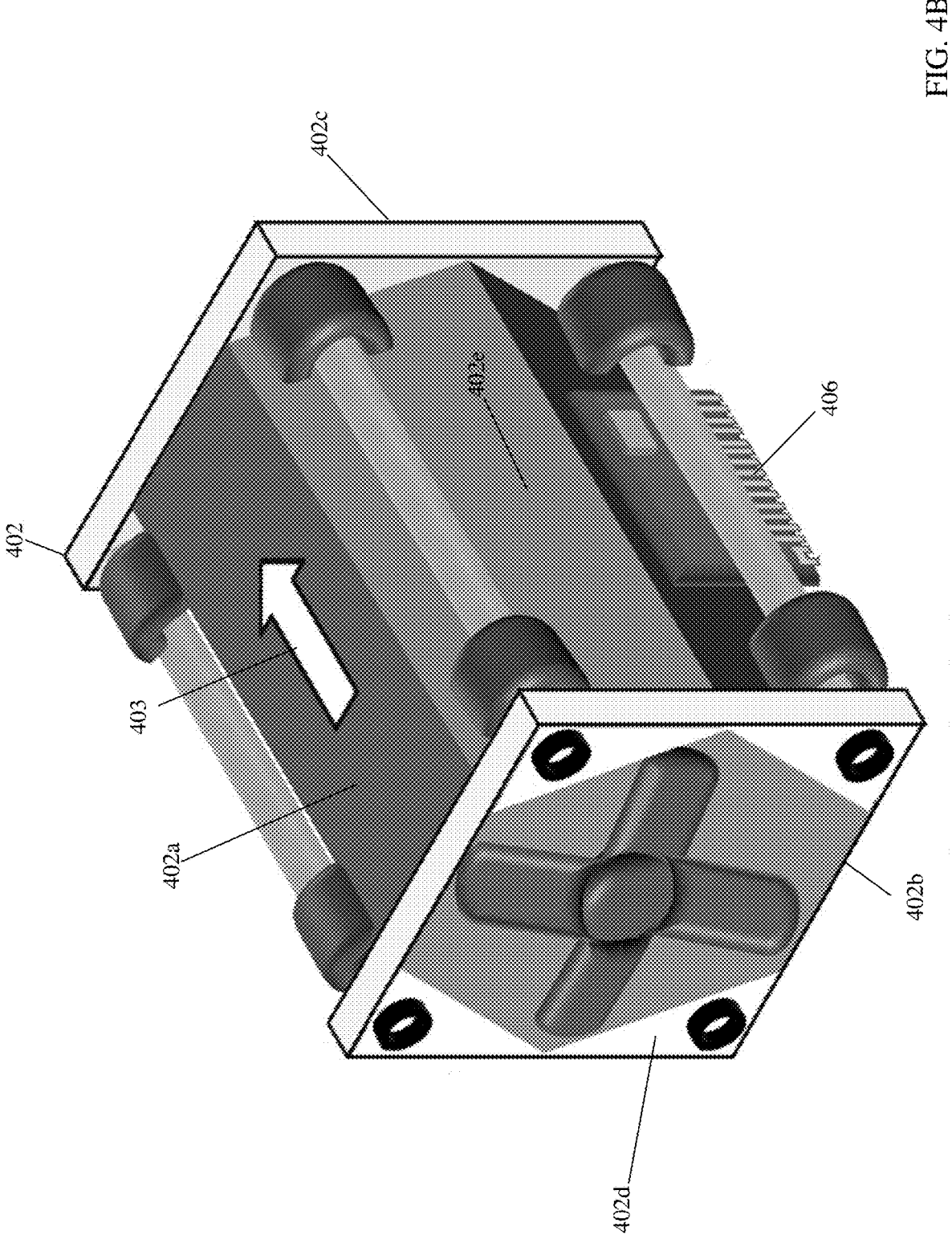
FIG. 4B is a perspective via illustrating an embodiment of the fan device of FIG. 4A.
Figure 4C:
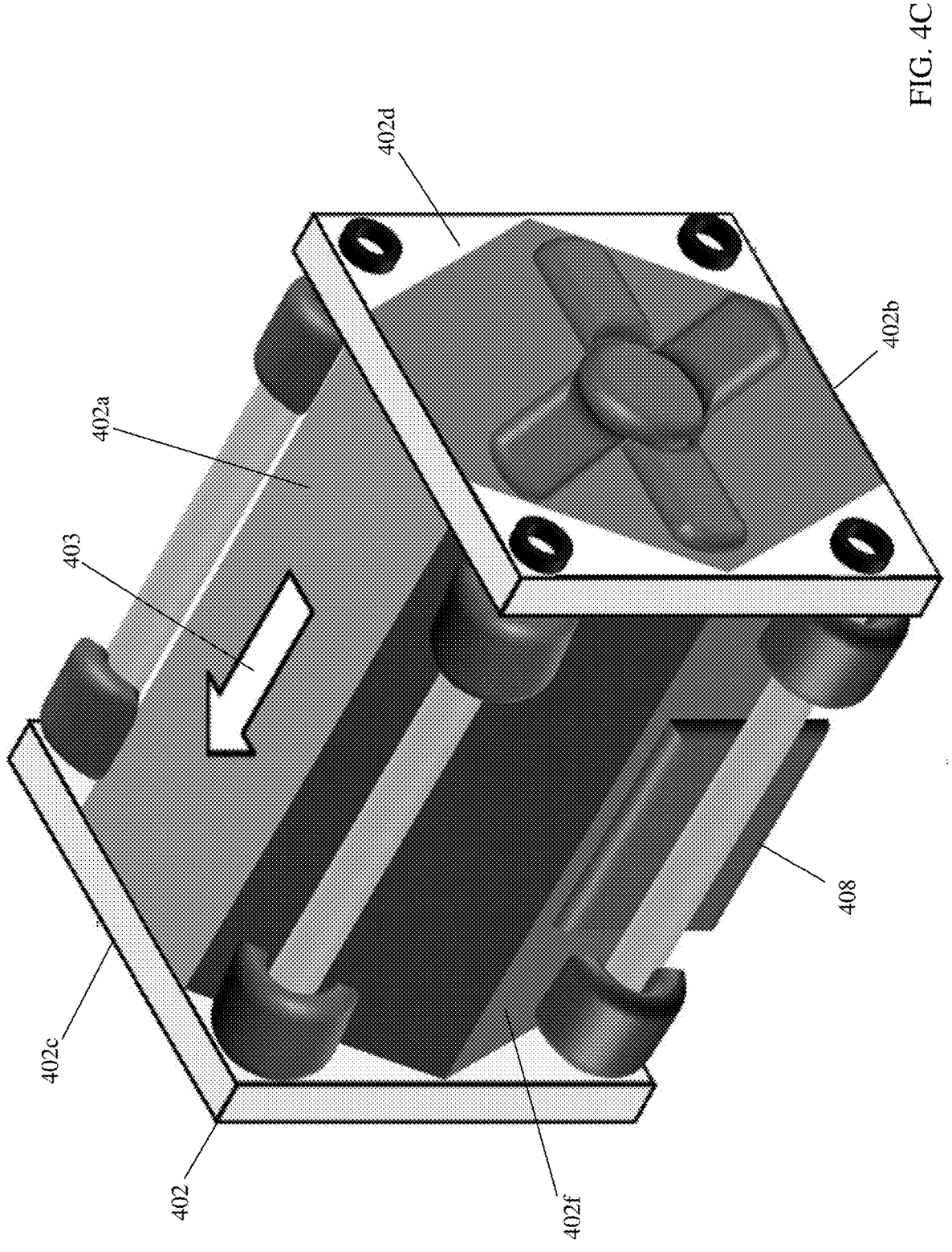
FIG. 4C is a perspective via illustrating an embodiment of the fan device of FIG. 4A.

Referring now to FIGS. 4A, 4B, and 4C, an embodiment of a fan device 400 is illustrated that may provide the configurable airflow direction fan system of the present disclosure. As described below, the fan device 400 may be provided in the IHS 100 discussed above with reference to FIG. 1 as one of the components of the IHS 100. In the illustrated embodiment, the fan device 400 includes a base 402 that supports the components of the fan device 400, only some of which are illustrated and described below. In embodiment illustrated in FIGS. 4B and 4C, the base 402 include a top surface 402a, a bottom surface 402b that is located opposite the base 402 from the top surface 402a, a front surface 402c that extends between the top surface 402a and the bottom surface 402b, a rear surface 402d that is located opposite the base 402 from the front surface 402c and that extends between the top surface 402a and the bottom surface 402b, and a pair of side surface 402e and 402f that are located opposite the base 402 from each other and that extend between the top surface 402a, the bottom surface 402b, the front surface 402c, and the rear surface 402d.

The illustrated embodiment includes threaded screw apertures that are defined by each of the front surface 402c and the rear surface 402d of the base 402 (e.g., via rivet nuts in the illustrated embodiment) and that are configured for use in mounting or otherwise securing the fan device 400 to the fan chassis 3000 discussed above with reference to FIGS.

3A and 3B. However, while a specific example is provided, one of skill in the art in possession of the present disclosure will appreciate how the base 402 may include variety of mounting and/or securing features that allow the fan device 400 to be mounted to the fan chassis 300 discussed above with reference to FIGS. 3A and 3B, as discussed in further detail below.

In an embodiment, the base 402 may support any of a variety of fan components 402 that one of skill in the art in possession of the present disclosure will appreciate may include one or more fans, a microcontroller, and/or any other fan components known in the art. In particular, the fan(s) supported by the base 402 may be include fan blades and/or other fan features that have been optimized to produce a maximum airflow in a single direction that one of skill in the art in possession of the present disclosure will exceed the airflow production capabilities of the conventional reversible fan systems described above (e.g., at or in excess of 25000 RPM). As illustrated in FIGS. 4B and 4C, an airflow direction indicator 403 may be provided on the top surface 402a of the base 402 to indicate the direction that the fan device 400 is configured to produce its airflow.

Furthermore, the base 402 may also support a memory device such as the EEPROM device 404 illustrated in FIG. 4A that may store fan device information (e.g., at address "0x55" in the EEPROM device 404) such as, for example, a serial number of the fan device 400, fan device manufacturer details such as a part number for the fan device 400, a number of fans included in the fan device 400, a maximum Rotations Per Minute (RPM) supported by the fan device 400, alarm(s) supported by the fan device 400, PWM characteristics of the fan device 400 (which one of skill in the art in possession of the present disclosure will appreciate may be used to "drive" or otherwise operate the fan device 400), interpreted TACH signal readings for the fan device 400, and/or any other fan device information that would be apparent to one of skill in the art in possession of the present disclosure. Furthermore, while not described in detail below, as discussed above some embodiments of the present disclosure may configure the EEPROM device 404 to enable the functionality of EEPROM device 306 of the fan chassis 300 discussed above with reference to FIGS. 3A and 3B while remaining within the scope of the present disclosure as well.

In the illustrated embodiment, a fan chassis connector 406 (e.g., a circuit board connector in the specific example illustrated in FIG. 4B) is located on the side surface 402e of the base 402 adjacent the bottom surface 402b of the base 402, and may be coupled to the fan components 402 via one or more couplings (e.g., trace(s) on the circuit board that provides the base 302) such as a PWM signal coupling, a TACH signal coupling, a Vcc coupling, a GND coupling, and/or other couplings that one of skill in the art in possession of the present disclosure would recognize as providing the functionality described below, while also being coupled to the EEPROM device 404 via one or more couplings (e.g., trace(s) on the circuit board that provides the base 302) such as an SCL signal coupling, an SDA signal coupling, a Vcc coupling, a GND coupling, and/or other couplings that one of skill in the art in possession of the present disclosure would recognize as providing the functionality described below. In a specific example, the fan chassis connector 406 may be configured (e.g., via the first two connector elements (also called "pins") on the fan chassis connector 406) to short circuit the GND coupling and the forward airflow detect coupling on either of the forward airflow direction fan device connector 310a and the reverse airflow direction fan device connector 310b included on the fan chassis 300.

In the embodiments illustrated and described below, a "dummy" connector 408 (e.g., circuit board connector in the specific example illustrated in FIG. 4C) is located on the side surface 402f of the base 402 adjacent the bottom surface 402b of the base 402, and as illustrated in FIG. 4A is not coupled to the fan components 402 or the EEPROM device 404 like the fan chassis connector 406 described above. As will be appreciated by one of skill in the art in possession of the present disclosure and as described below, the "dummy" connector 408 is configured to connect to the forward airflow direction fan device connector 310a or the reverse airflow direction fan device connector 310b in the fan chassis 300 discussed above with reference to FIGS. 3A and 3B in different fan device airflow direction orientations in order to provide structural support for the fan device 400 in the fan chassis 300, and thus does not require the couplings provided for the fan chassis connector 406. Furthermore, one of skill in the art in possession of the present disclosure will appreciate how the fan device mounting subsystem on the fan chassis 300 may provide sufficient structure support for the fan device 400 in the fan chassis 300, and thus how the "dummy" connector 408 may be omitted in some embodiments.

However, while a specific fan device 400 has been illustrated and described, one of skill in the art in possession of the present disclosure will recognize that fan devices (or other devices operating according to the teachings of the present disclosure in a manner similar to that described below for the fan device 400) may include a variety of components and/or component configurations for providing conventional fan device functionality, as well as the configurable airflow direction fan functionality discussed below, while remaining within the scope of the present disclosure as well.

Referring now to FIG. 5, an embodiment of a method 500 for configuring an airflow direction of a fan system is illustrated. As discussed below, the systems and methods of the present disclosure provide a fan chassis that is configured to connect to a computing device, as well as to receive a fan device in either a first airflow direction orientation that allows the fan device to produce an airflow in a first direction relative to the fan chassis, or a second airflow direction orientation that allows the fan device to produce the airflow in a second direction relative to the fan chassis that is opposite the first direction. For example, the configurable airflow direction fan system of the present disclosure may include a fan device with a fan chassis connector, and a fan chassis that connects to a computing device. A first airflow direction fan device connector on the fan chassis connects to the fan chassis connector on the fan device when the fan device is mounted to the fan chassis in a first airflow direction orientation that will produce a first direction airflow in the computing device when the fan chassis is positioned in the computing device. A second airflow direction fan device connector on the fan chassis connects to the fan chassis connector on the fan device when the fan device is mounted to the fan chassis in the second airflow direction orientation that will produce a second direction airflow in the computing device that is different than the first direction airflow when the fan chassis is positioned in the computing device. As such, the airflow produced by fan devices in a computing device is configured to be provided in multiple different directions without the limitations of conventional "reversible" fan systems.

Figure 6A:
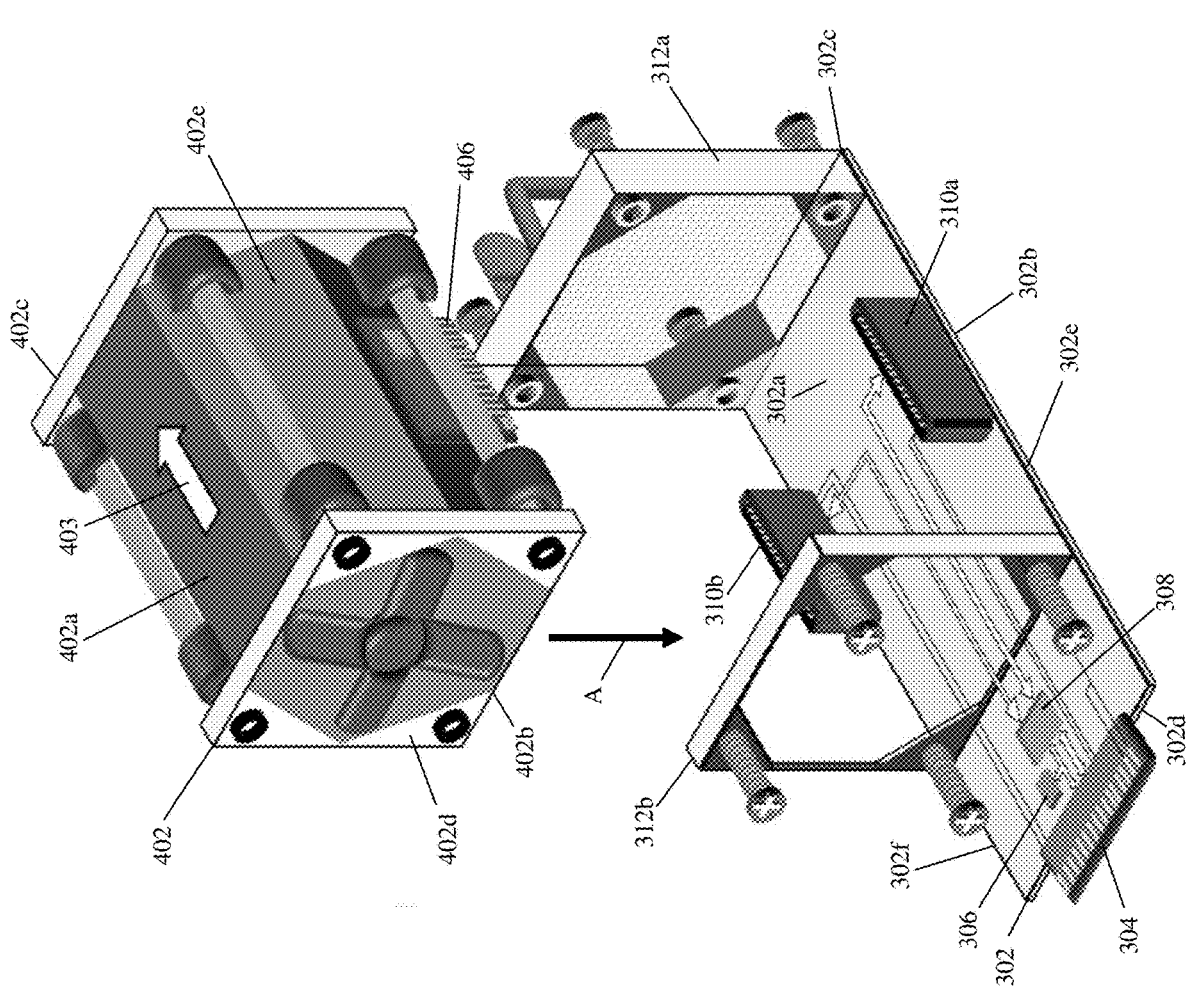
FIG. 6A is a perspective view illustrating an embodiment of the fan device of FIGS. 4A-4C being positioned in the fan chassis of FIGS. 3A and 3B in a first airflow direction orientation during the method of FIG. 5.

The method 500 begins at block 502 where a fan device is mounted to a fan chassis in a first airflow direction orientation. With reference to FIG. 6A, in an embodiment of block 502, the fan device 400 discussed above with reference to FIGS. 4A-4C may be positioned adjacent the fan chassis 300 of FIGS. 3A and 3B such that the bottom surface 402b of the base 402 of the fan device 400 is located adjacent the fan chassis 300 with the fan chassis connector 406 and the dummy connector 408 on the fan device 400 aligned with the forward airflow direction fan device connector 310a and the reverse airflow direction fan device connector 310b, respectively, on the fan chassis 300.

As will be appreciated by one of skill in the art in possession of the present disclosure, the orientation of the fan device 400 relative to the fan chassis 300 may be selected by a user based on an airflow direction that is desired to be produced in the computing device 200 discussed above with reference to FIG. 2. In the specific examples provided below, the fan chassis 300 is configured to be connected to the computing device 200 so that the front surface 302c of the base 302 on the fan chassis 300 faces the rear surface 202b of the chassis 202 of the computing device 200, with the orientation of the fan device 400 relative to the fan chassis 300 as illustrated in FIG. 6A configured to produce an airflow via airflow apertures defined on the front surface 202a of the chassis 202 of the computing device 200, through the computing device 200, and out of airflow apertures defined on the rear surface 202b of the chassis 202 of the computing device 200 (i.e., a "forward airflow direction"). However, one of skill in the art in possession of the present disclosure will appreciate how different configurations of the computing device, fan chassis, and fan device of the present disclosure may be utilized to provide the different airflow directions described below while remaining within the scope of the present disclosure as well.

Figure 6B:
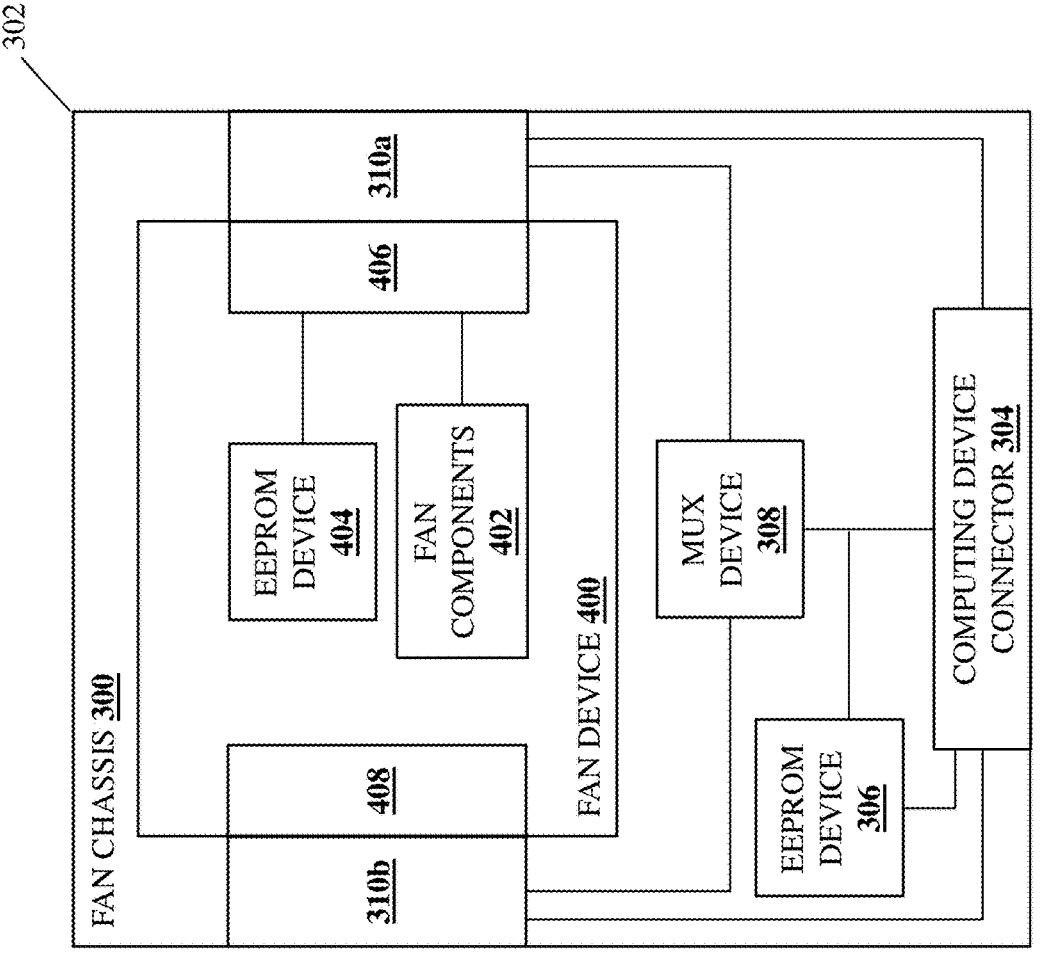
FIG. 6B is a schematic view illustrating an embodiment of the fan device of FIGS. 4A-4C positioned in the fan chassis of FIGS. 3A and 3B in the first airflow direction orientation during the method of FIG. 5.

The fan device 400 may then be moved in a direction A towards the fan chassis 300 such that the fan chassis connector 406 on the fan device 400 engages the forward airflow direction fan device connector 310a, and the dummy connector 408 on the fan device 400 engages the reverse airflow direction fan device connector 310b, as illustrated in FIG. 6B. In an embodiment, a user may then tighten the captive screws included on the fan mounting elements 312a and 312b such that they engage the screw apertures defined by the base 402 of the fan device 400 and mount or otherwise secure the fan device 400 in the fan chassis 300.

Figure 7:
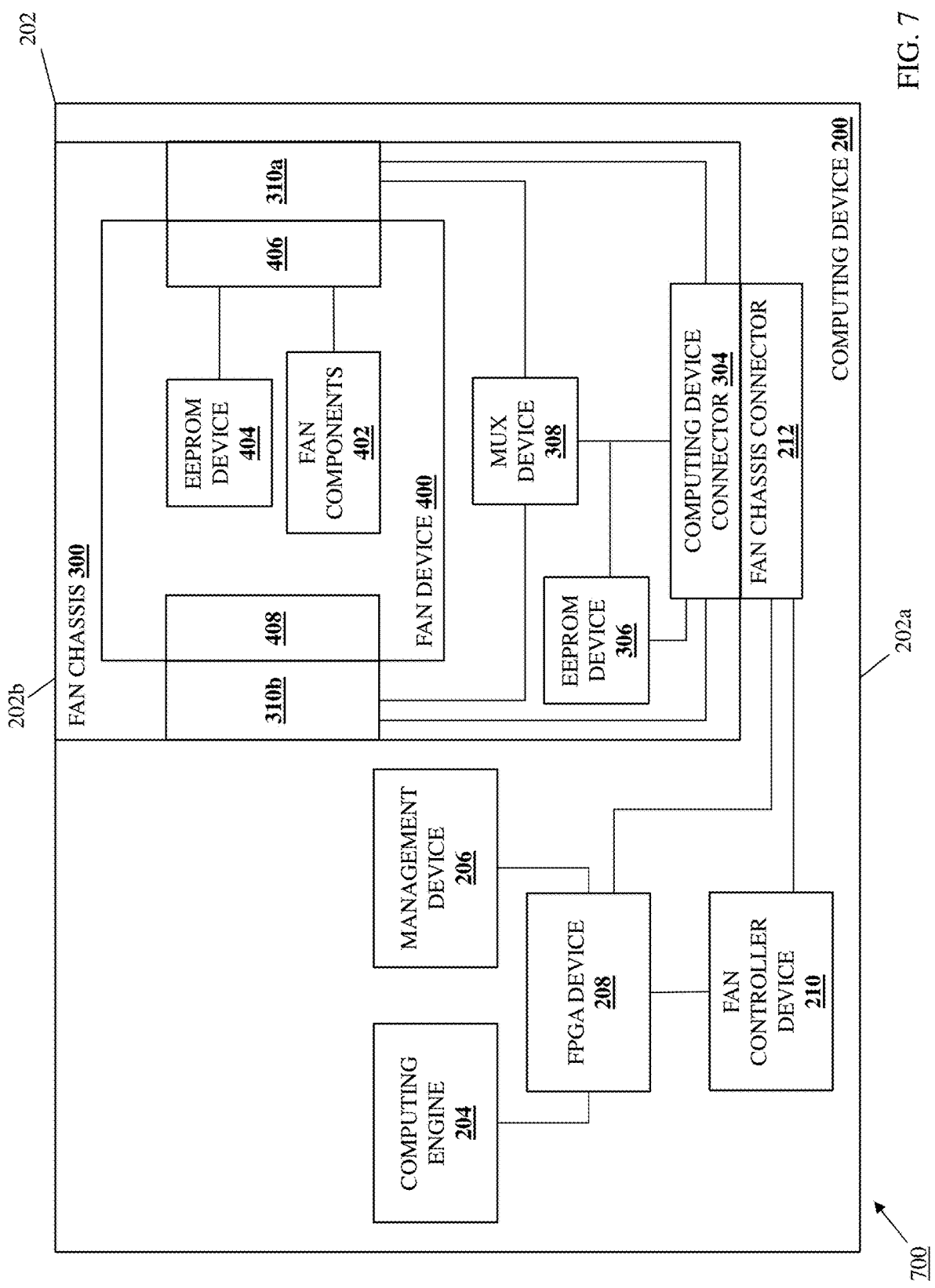
FIG. 7 is a schematic view illustrating an embodiment of the fan chassis and fan device of FIGS. 6A and 6B positioned in the computing device of FIG. 2 during the method of FIG. 5.
Figure 8A:
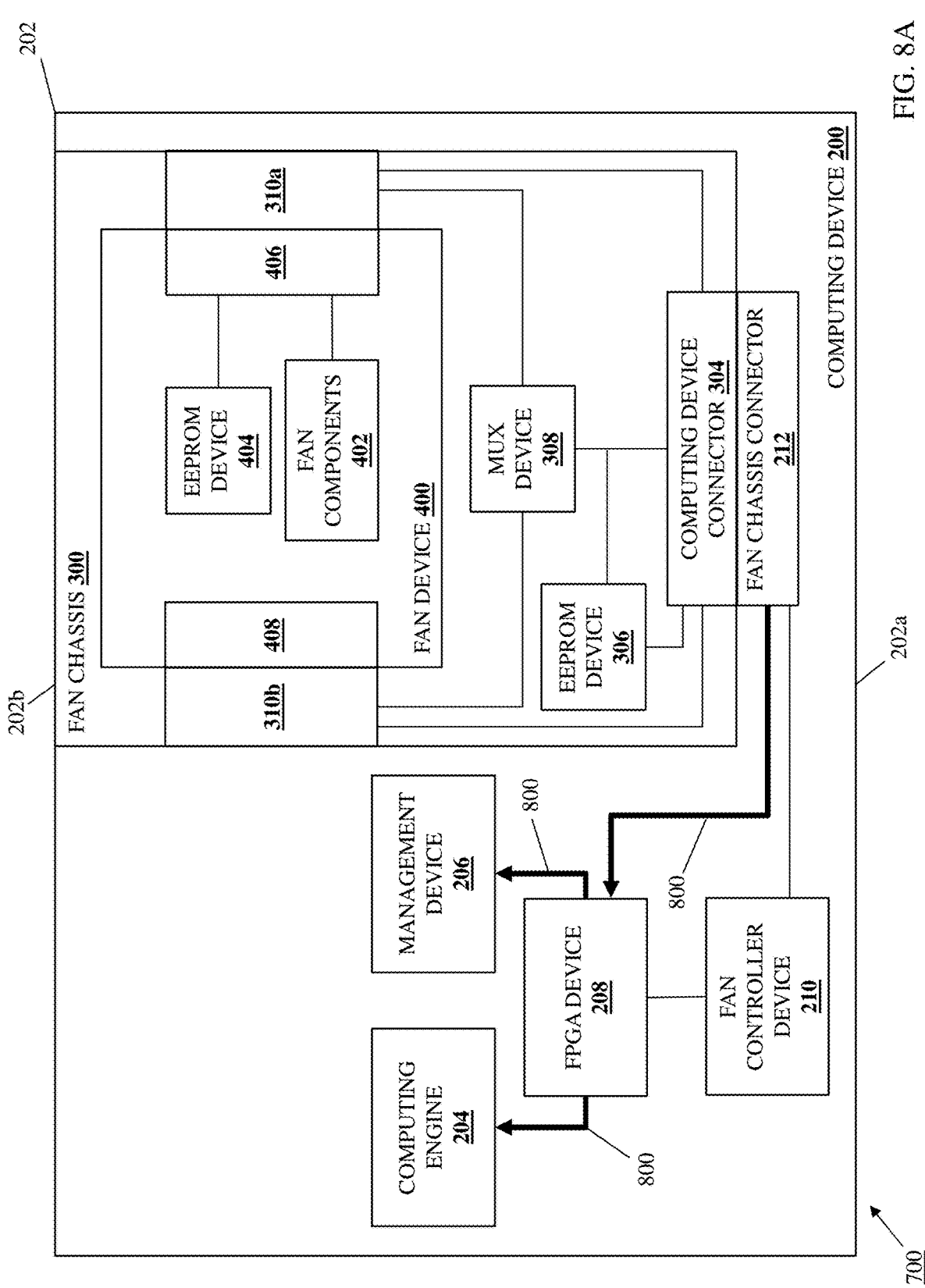
FIG. 8A is a schematic view illustrating an embodiment of the computing device, fan chassis, and fan device of FIG. 7 operating during the method of FIG. 5.

The method 500 then proceeds to block 504 where the fan chassis is connected to a computing device. With reference to FIG. 7, in an embodiment of block 504, the fan chassis 300 with the fan device 400 mounted to it may be positioned in the chassis 202 of the computing device 200 such that the computing device connector 304 on the fan chassis 300 engages the fan chassis connector 212 on the computing device 200 to provide a fan system 700. With reference to FIG. 8A, in an embodiment, the connection of the computing device connector 304 on the fan chassis 300 to the fan chassis connector 212 on the computing device 200 will cause the fan system 700 to perform interrupt operations 800 that include the transmission of a fan chassis presence signal via the fan chassis presence signal coupling to the FPGA device 208 in the computing device 200 to cause the FPGA device 208 to generate an interrupt that may be received by the computing engine 204 (e.g., an operating system provided by the computing engine 204) or the management device 206.

Figure 8B:
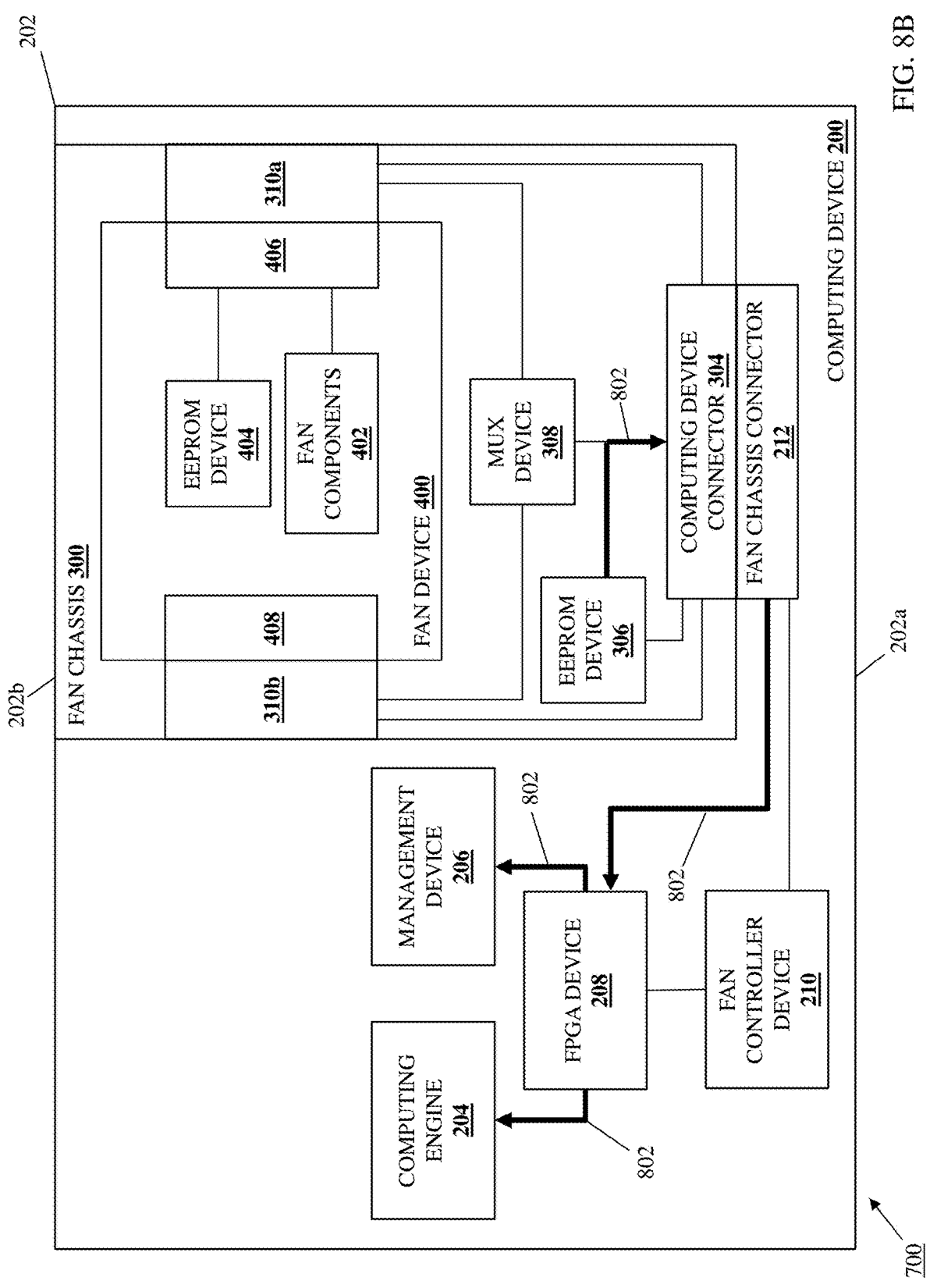
FIG. 8B is a schematic view illustrating an embodiment of the computing device, fan chassis, and fan device of FIG. 7 operating during the method of FIG. 5.
Figure 8C:
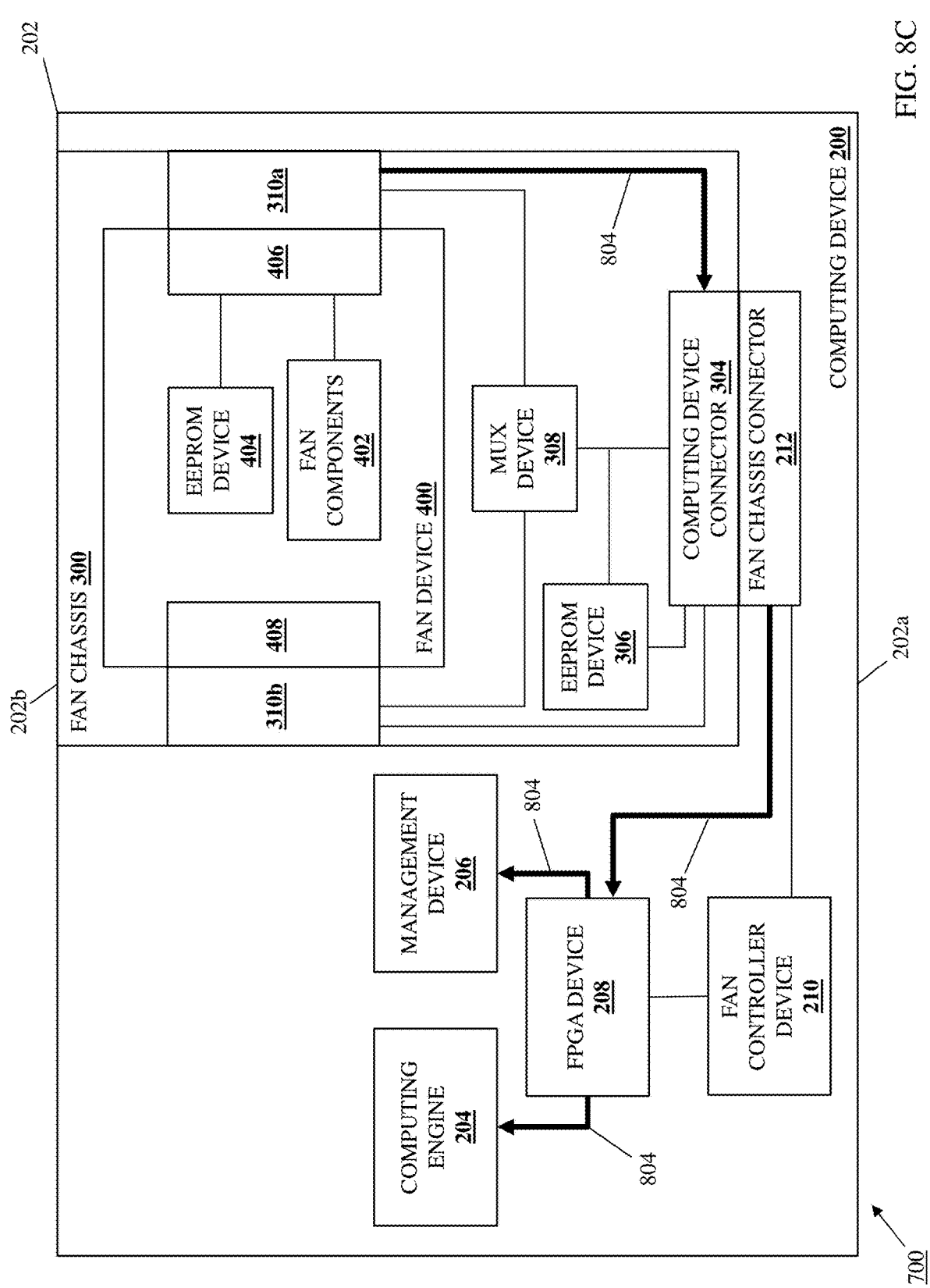
FIG. 8C is a schematic view illustrating an embodiment of the computing device, fan chassis, and fan device of FIG. 7 operating during the method of FIG. 5.
Figure 8D:
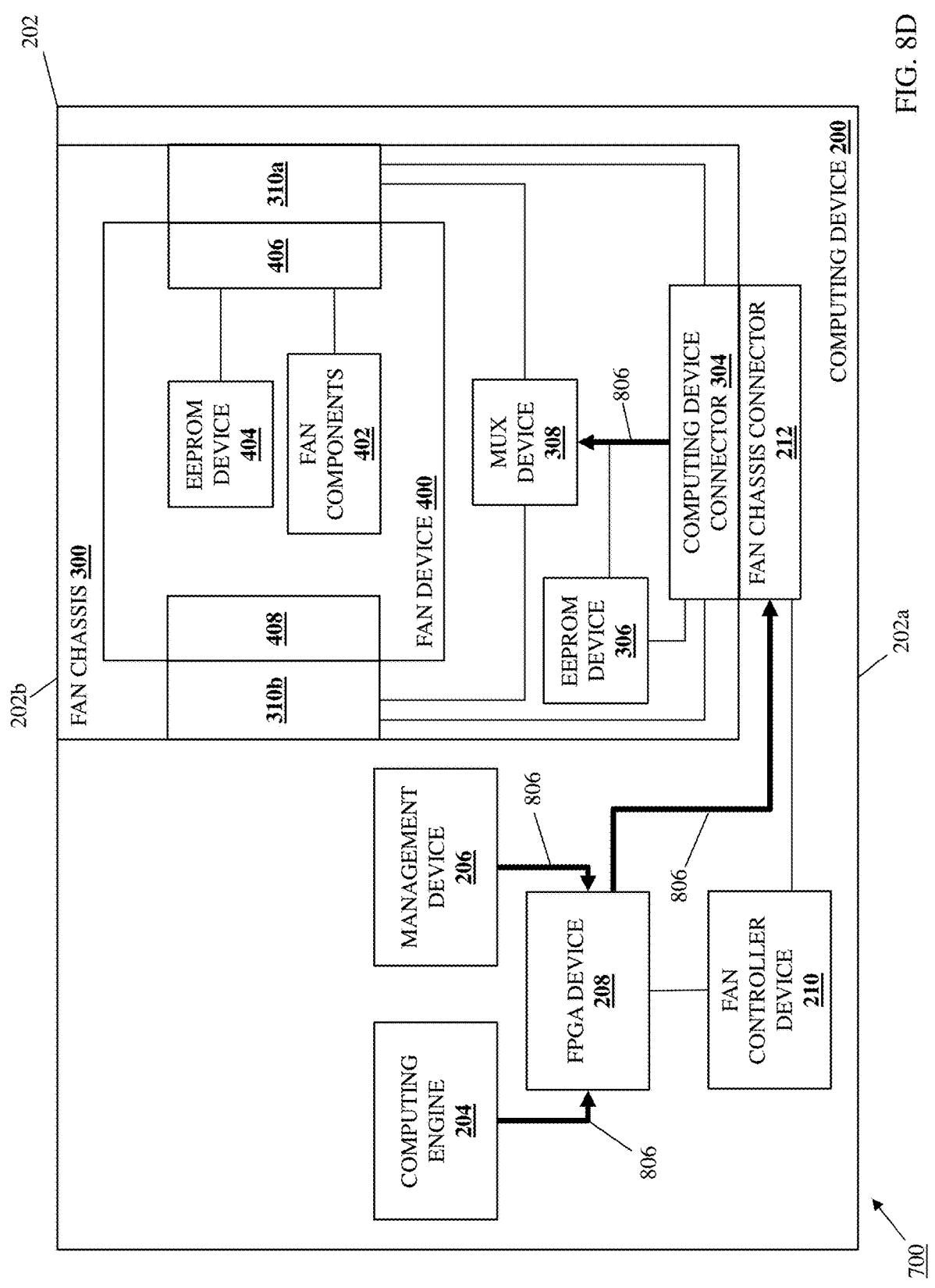
FIG. 8D is a schematic view illustrating an embodiment of the computing device, fan chassis, and fan device of FIG. 7 operating during the method of FIG. 5.

With reference to FIG. 8B, in response to receiving the interrupt, the computing engine 204 or the management device 206 may perform fan chassis EEPROM device access operations 802 that may include accessing the EEPROM device 306 in the fan chassis 300 (which may be visible via an I2C bus in the fan chassis 300) in order to retrieve, for example, an identifier for the fan chassis 300 (e.g., an SKU for the fan chassis 300 that identifies its manufacturer), the configurable airflow direction fan capabilities of the fan chassis 300, and/or any other information that would be apparent to one of skill in the art in possession of the present disclosure. Furthermore, as discussed above, in some examples the fan chassis connector 406 on the fan device 400 may be configured to short circuit the GND coupling and the forward airflow detect coupling to the forward airflow direction fan device connector 310a (e.g., via the first two connector elements (also called "pins") on the fan chassis connector 406), which may cause the fan system 700 to perform forward airflow direction identification operations 804 that "drive" a forward airflow detect signal that is transmitted via the computing device connector 304 and the fan chassis connector 212 to a "low" value (e.g., via a "pull-up" resistor, not illustrated), allowing the computing engine 204 or the management device 206 to identify that the fan device 400 is oriented in the forward airflow direction orientation.

However, one of skill in the art in possession of the present disclosure will appreciate how the computing engine 204 or the management device 206 may identify that the fan device 400 is oriented in the forward airflow direction orientation via a forward airflow detect presence signal that may be transmitted via the fan chassis presence signal coupling in the computing device 200 as part of the interrupt. As such, one of skill in the art in possession of the present disclosure will appreciate how the forward airflow direction orientation of the fan device 400 illustrated in FIG. 7 may be detected in a variety of manners that will fall within the scope of the present disclosure as well.

Following the identification that the fan device 400 is oriented in the forward airflow direction orientation, the computing engine 204 or the management device 206 may perform multiplexer configuration operations 806 that include activating the multiplexer device 308 by generating and transmitting an EN signal via the EN signal coupling between the computing device connector 304 and the multiplexer device 308 in the fan chassis 300, which one of skill in the art in possession of the present disclosure will appreciate may cause the multiplexer device 308 to power on. Furthermore, the multiplexer configuration operations 806 may also include the computing engine 204 or the management device 206 configuring the multiplexer device 308 to transmit fan control signals to the forward airflow direction fan device connector 310a by, for example, generating and transmitting SEL signals via the SEL signal coupling between the computing device connector 304 and the multiplexer device 308 in the fan chassis 300.

Figure 8E:
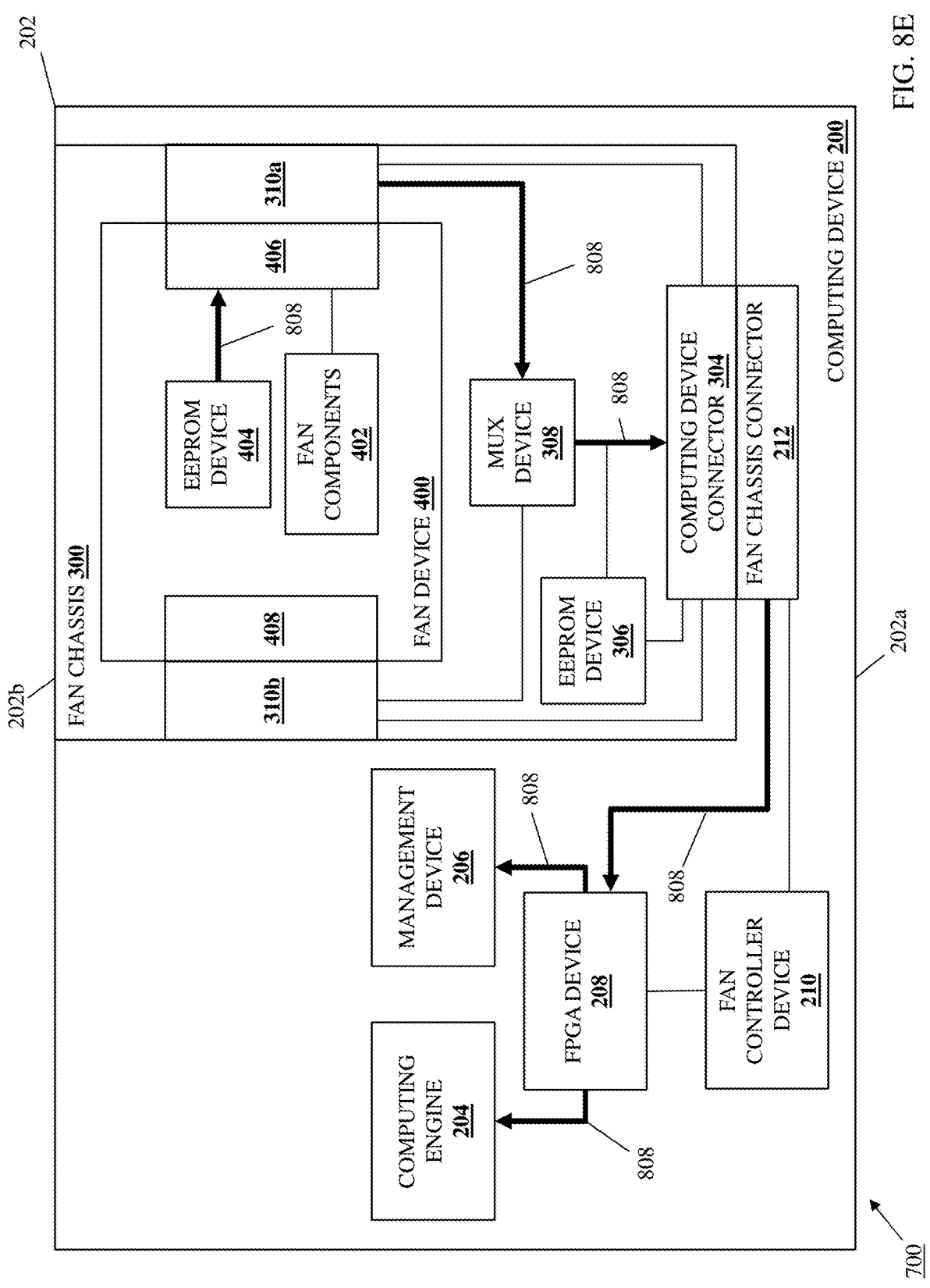
FIG. 8E is a schematic view illustrating an embodiment of the computing device, fan chassis, and fan device of FIG. 7 operating during the method of FIG. 5.

With reference to FIG. 8E, following the configuration of the multiplexer device 308, the computing engine 204 or the management device 206 may perform fan device EEPROM device access operations 808 that may include accessing the EEPROM device 404 in the fan device 400 (which may be visible via an I2C bus in the fan chassis 300) via the multiplexer device 308 and the forward airflow direction fan device connector 310a configured as discussed above, and may retrieve fan device capability information such as, for example, an identifier for the fan device 400 (e.g., a serial number of the fan device 400), fan device manufacturer information for the fan device 400, a part number for the fan device 400, a number of fans in the fan device 400, a maximum RPM supported by the fan device 400, alarms supported by the fan device 400, PWM characteristics of the fan device 400 (i.e., fan device driving information), TACH reading interpretation information for the fan device 400, and/or any other fan device information that would be apparent to one of skill in the art in possession of the present disclosure.

Figure 8F:
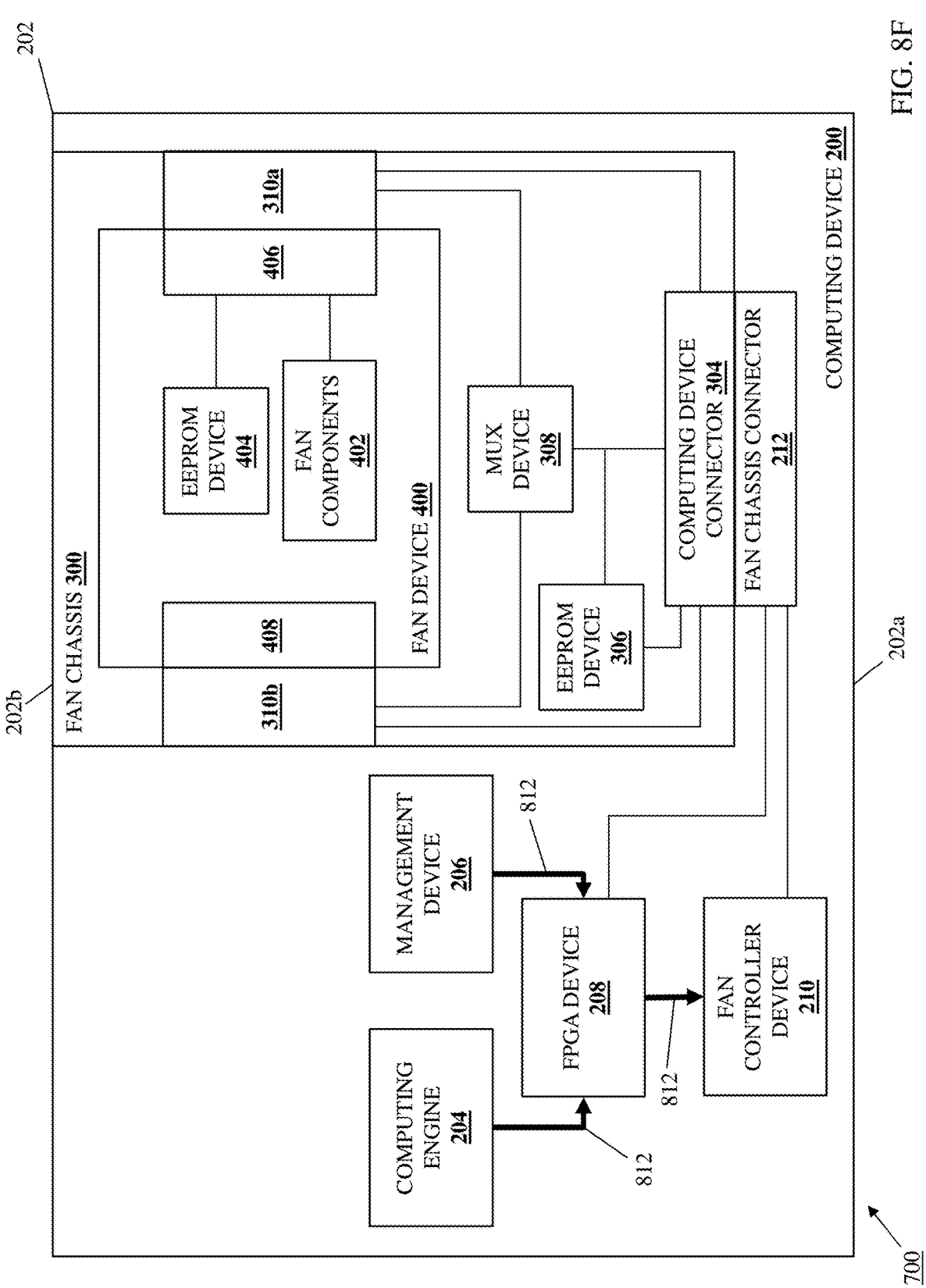
FIG. 8F is a schematic view illustrating an embodiment of the computing device, fan chassis, and fan device of FIG. 7 operating during the method of FIG. 5.
Figure 8G:
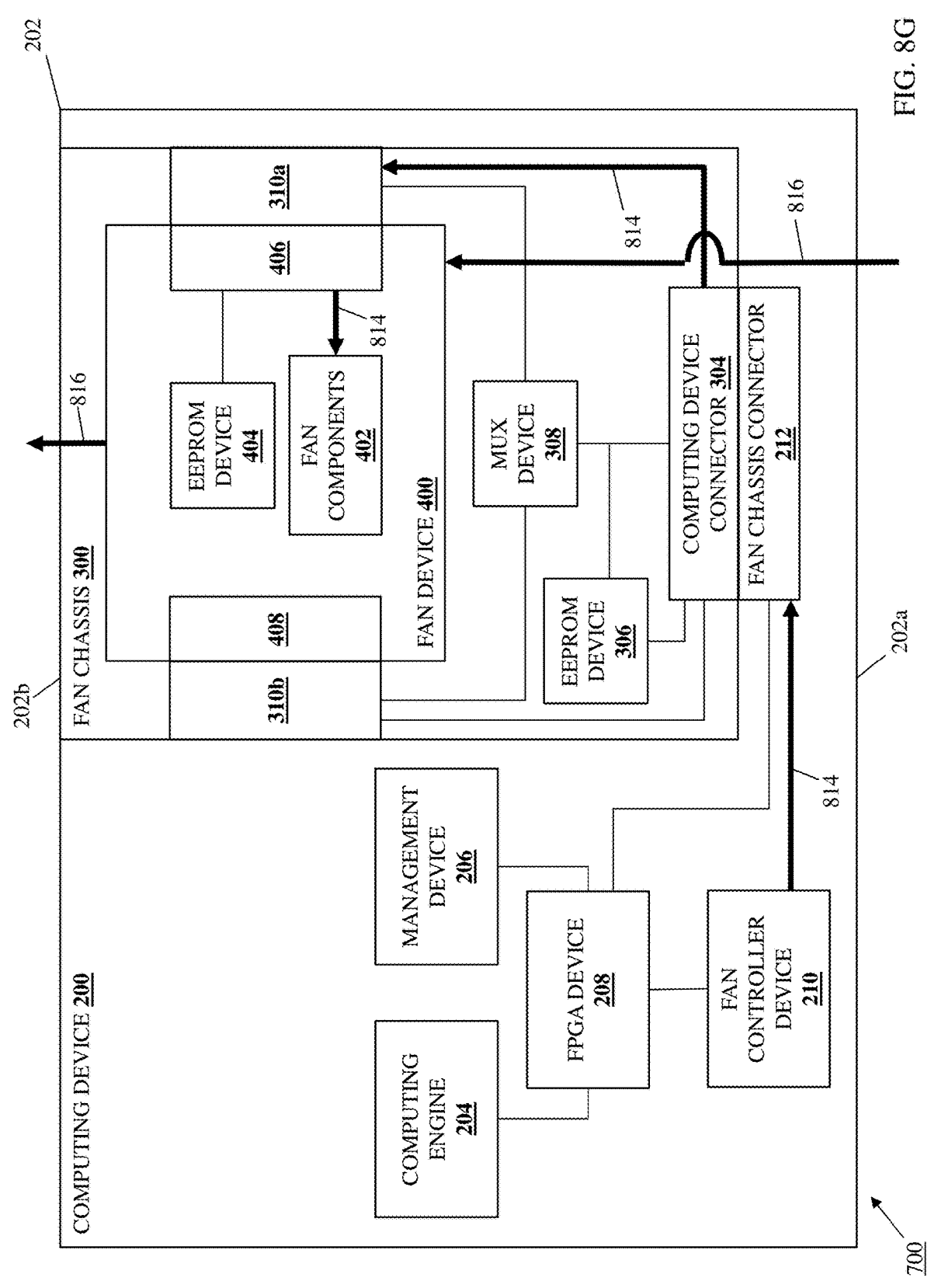
FIG. 8G is a schematic view illustrating an embodiment of the computing device, fan chassis, and fan device of FIG. 7 operating during the method of FIG. 5.

The method 500 then proceeds to block 506 where the computing device controls the fan device to produce airflow in a first direction. With reference to FIG. 8F, in an embodiment of block 506, the computing engine 204 or the management device 206 may perform fan controller programming operations 812 that may include programming the fan controller device 210 to control the operation of the fan device 400 using any of the information retrieved at block 504 discussed above and via any of a variety of fan controller programming techniques that would be apparent to one of skill in the art in possession of the present disclosure. With reference to FIG. 8G, in an embodiment of block 506 and following the programming of the fan controller device 210, the fan controller device 210 may perform fan control operations 814 that may include controlling the operation of the fan device 400, which as described above may cause the fan device 400 to produce an airflow 816 in the computing device 200 in a forward airflow direction (e.g., via airflow apertures defined on the front surface 202a of the chassis 202 of the computing device 200, through the computing device 200, and out of airflow apertures defined on the rear surface 202b of the chassis 202 of the computing device 200).

The method 500 then proceeds to decision block 508 where the method 500 proceeds depending on whether an airflow direction change is required in the computing device. As will be appreciated by one of skill in the art in possession of the present disclosure, the fan system of the present disclosure allows the fan device to be reoriented in the fan chassis in order to produce an airflow in a reverse airflow direction that is opposite the forward airflow direction described above. For example, a user of the computing device 200 may decide to move and/or reorient the computing device 200 in a rack such that the forward airflow direction orientation of the fan device 400 included therein would otherwise draw hot air from a hot side of the rack into the computing device 200, and thus may require an airflow direction change in the computing device 200. However, while a specific example has been described, one of skill in the art in possession of the present disclosure will appreciate how other reasons for changing an airflow direction in a computing device will fall within the scope of the present disclosure as well. If, at decision block 508, no airflow direction change is required in the computing device, the method 500 returns to block 506. As such, the method 500 may loop such that the fan device 400 is controlled to produce the airflow in the forward airflow direction in the computing device 200 as long as no airflow direction change is required in the computing device 200.

If, at decision block 508, an airflow direction change is required in the computing device, the method 500 proceeds to block 510 where the fan device is mounted to the fan chassis in a second airflow direction orientation. In an embodiment, at block 510, the fan chassis 300 may be disconnected from the computing device 200 by disconnecting the computing device connector 304 on the fan chassis 300 from the fan chassis connector 212 on the computing device 200, as well as disconnecting any other mounting/ securing features that one of skill in the art in possession of the present disclosure would appreciate allow the fan chassis 300 to be removed from the computing device 200. The fan device 400 may then be disconnected from the fan chassis 300 by untightening the captive screws included on the fan mounting elements 312a and 312b such that they disengage the screw apertures defined by the base 402 of the fan device 400, and then disconnecting the fan chassis connector 406 and the dummy connector 408 on the fan device 400 from the forward airflow direction fan device connector 310a and the reverse airflow direction fan device connector 310b, respectively, on the fan chassis 300.

Figure 9A:
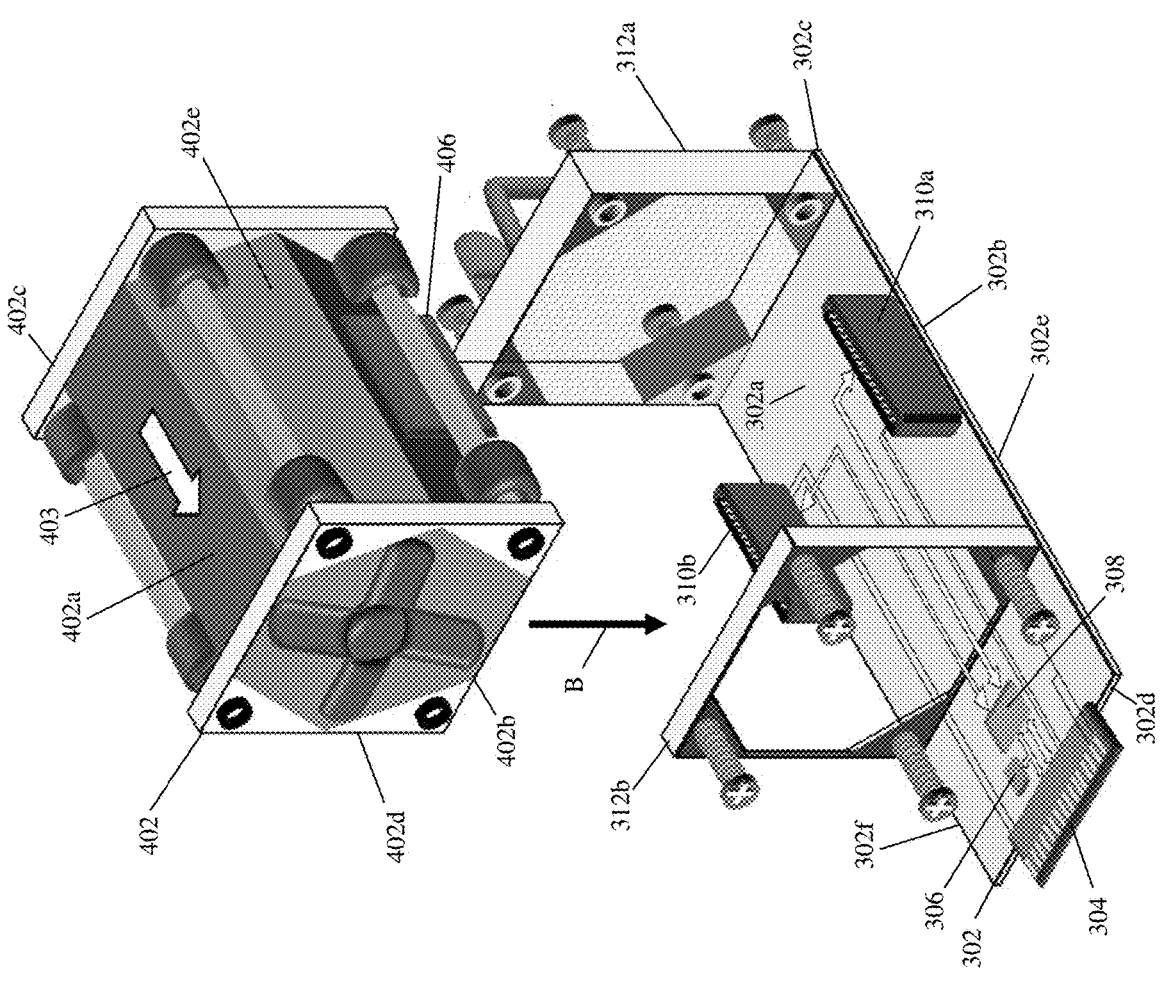
FIG. 9A is a perspective view illustrating an embodiment of the fan device of FIGS. 4A-4C being positioned in the fan chassis of FIGS. 3A and 3B in a second airflow direction orientation during the method of FIG. 5.

With reference to FIG. 9A, in an embodiment of block 510, the fan device 400 may be positioned adjacent the fan chassis 300 of FIGS. 3A and 3B such that the bottom surface 402b of the base 402 of the fan device 400 is located adjacent the fan chassis 300 with the fan chassis connector 406 and the dummy connector 408 on the fan device 400 aligned with the reverse airflow direction fan device connector 310b and the forward airflow direction fan device connector 310a, respectively, on the fan chassis 300.

As discussed above, the orientation of the fan device 400 relative to the fan chassis 300 may be selected by a user based on a desired airflow direction in the computing device 200 discussed above with reference to FIG. 2, and the fan chassis 300 is configured to be connected to the computing device 200 so that the front surface 302c of the base 302 on the fan chassis 300 faces the rear surface 202b of the chassis 202 of the computing device 200, with the orientation of the fan device 400 relative to the fan chassis 300 as illustrated in FIG. 9A configured to produce an airflow via airflow apertures defined on the rear surface 202b of the chassis 202 of the computing device 200, through the computing device 200, and out of airflow apertures defined on the front surface 202a of the chassis 202 of the computing device 200 (i.e., a "reverse airflow direction"). However, one of skill in the art in possession of the present disclosure will appreciate how different configurations of the computing device, fan chassis, and fan device of the present disclosure may be utilized to provide the different airflow directions described below while remaining within the scope of the present disclosure as well.

Figure 9B:
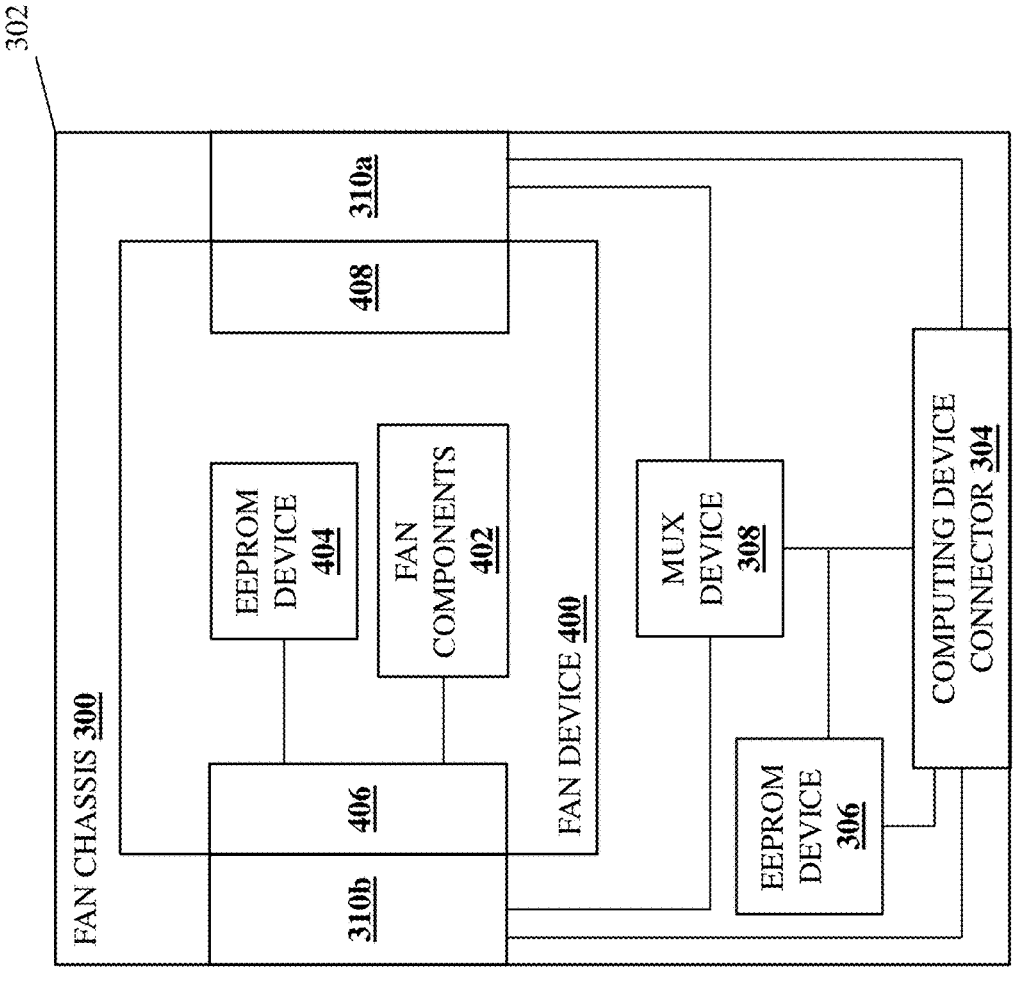
FIG. 9B is a schematic view illustrating an embodiment of the fan device of FIGS. 4A-4C positioned in the fan chassis of FIGS. 3A and 3B in the second airflow direction orientation during the method of FIG. 5.

The fan device 400 may then be moved in a direction B towards the fan chassis 300 such that the fan chassis connector 406 on the fan device 400 engages the reverse airflow direction fan device connector 310b, and the dummy connector 408 on the fan device 400 engages the forward airflow direction fan device connector 310a, as illustrated in FIG. 9B. In an embodiment, a user may then tighten the captive screws included on the fan mounting elements 312a and 312b such that they engage the screw apertures defined by the base 402 of the fan device 400 and mount or otherwise secure the fan device 400 in the fan chassis 300.

Figure 10:
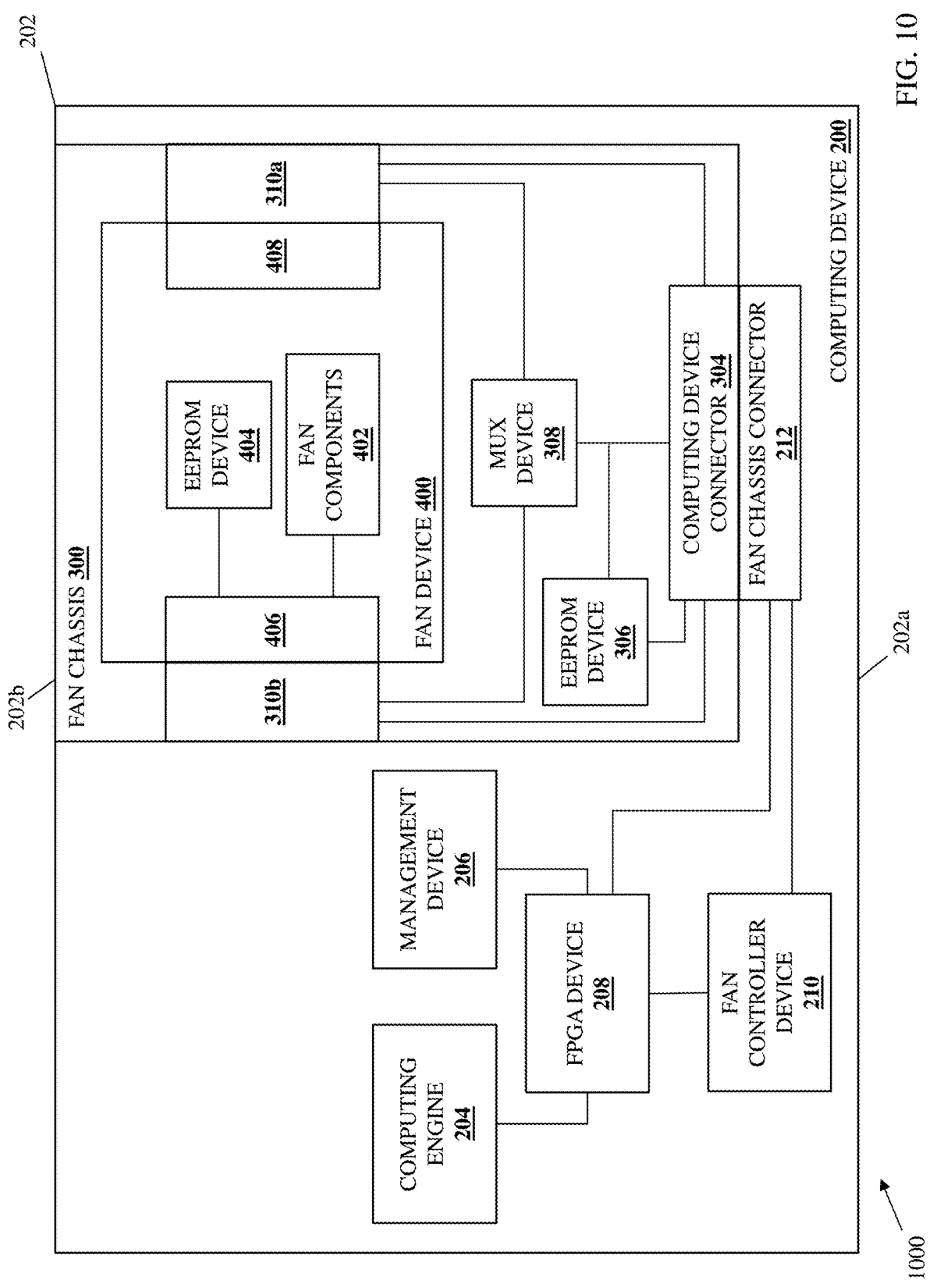
FIG. 10 is a schematic view illustrating an embodiment of the fan chassis and fan device of FIGS. 8A and 8B positioned in the computing device of FIG. 2 during the method of FIG. 5.
Figure 11A:
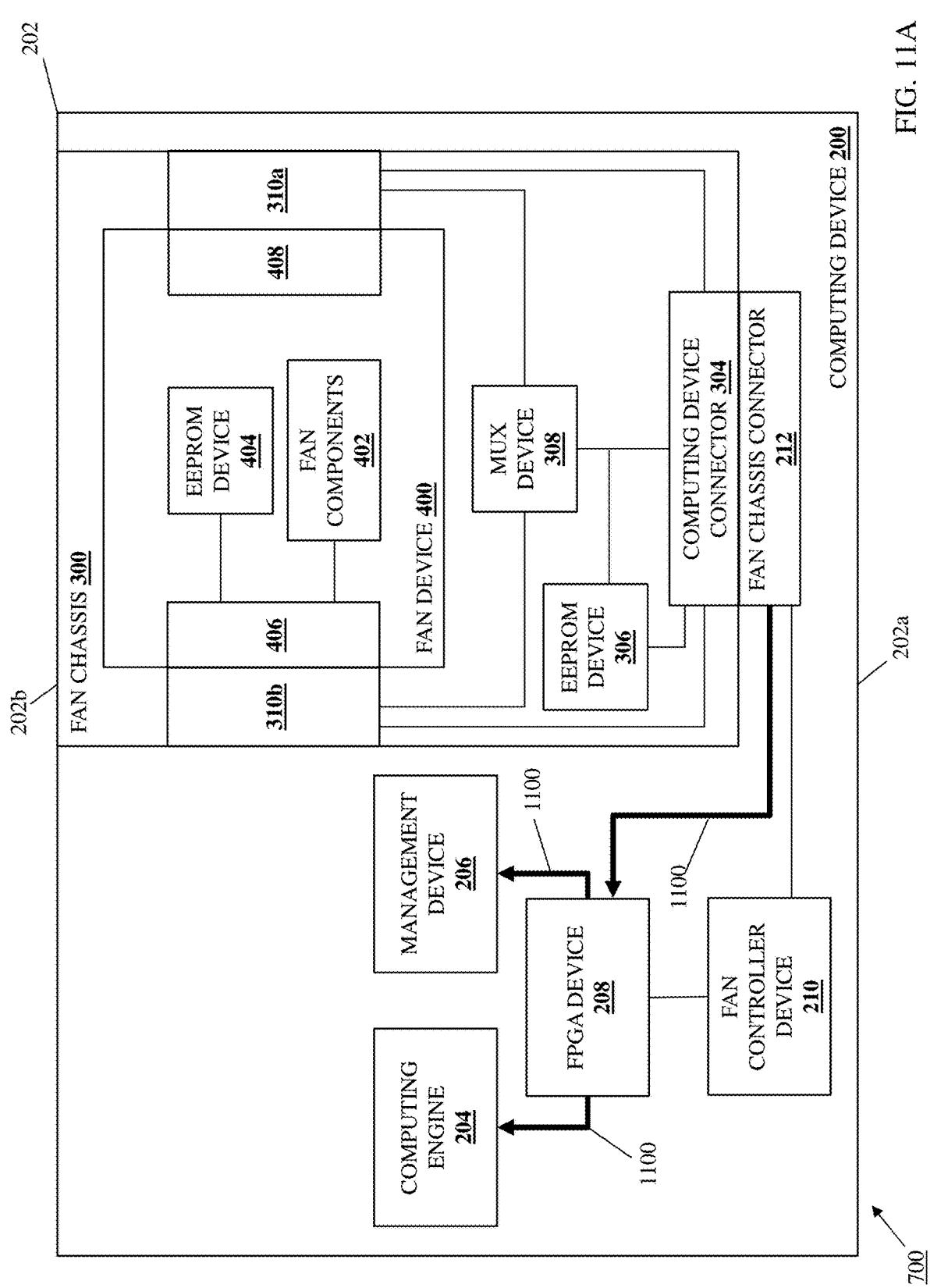
FIG. 11A is a schematic view illustrating an embodiment of the computing device, fan chassis, and fan device of FIG. 9 operating during the method of FIG. 5.

The method 500 then proceeds to block 512 where the fan chassis is connected to the computing device. With reference to FIG. 10, in an embodiment of block 504, the fan chassis 300 with the fan device 400 mounted to it may be positioned in the chassis 202 of the computing device 200 such that the computing device connector 304 on the fan chassis 300 engages the fan chassis connector 212 on the computing device 200 to provide a fan system 1000. With reference to FIG. 11A, in an embodiment, the connection of the computing device connector 304 on the fan chassis 300 to the fan chassis connector 212 on the computing device 200 will cause the fan system 1000 to perform interrupt operations 1100 that include the transmission of a fan chassis presence signal via the fan chassis presence signal coupling to the FPGA device 208 in the computing device 200 to cause the FPGA device 208 to generate an interrupt that may be received by the computing engine 204 (e.g., an operating system provided by the computing engine 204) or the management device 206.

Figure 11B:
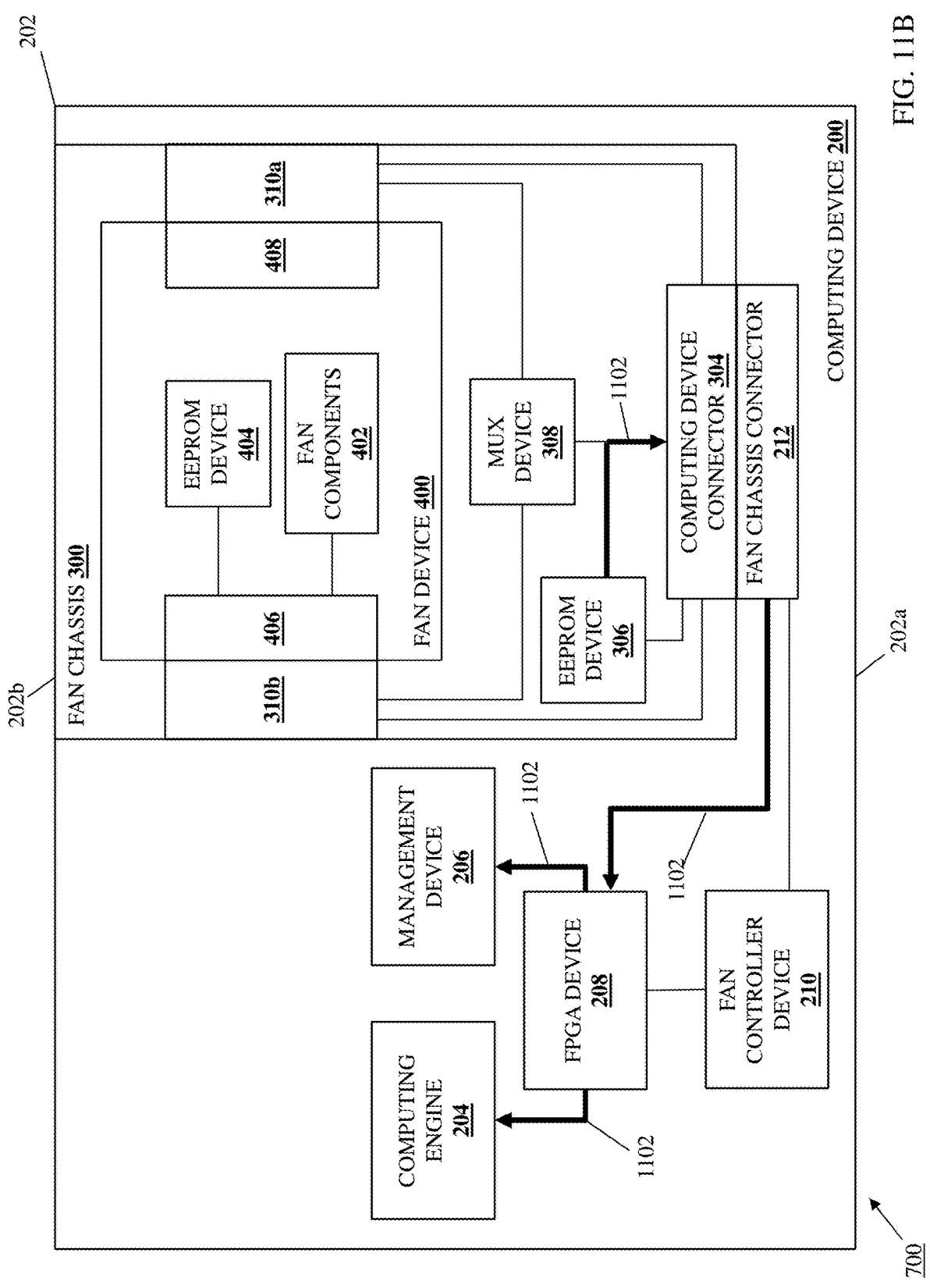
FIG. 11B is a schematic view illustrating an embodiment of the computing device, fan chassis, and fan device of FIG. 9 operating during the method of FIG. 5.
Figure 11C:
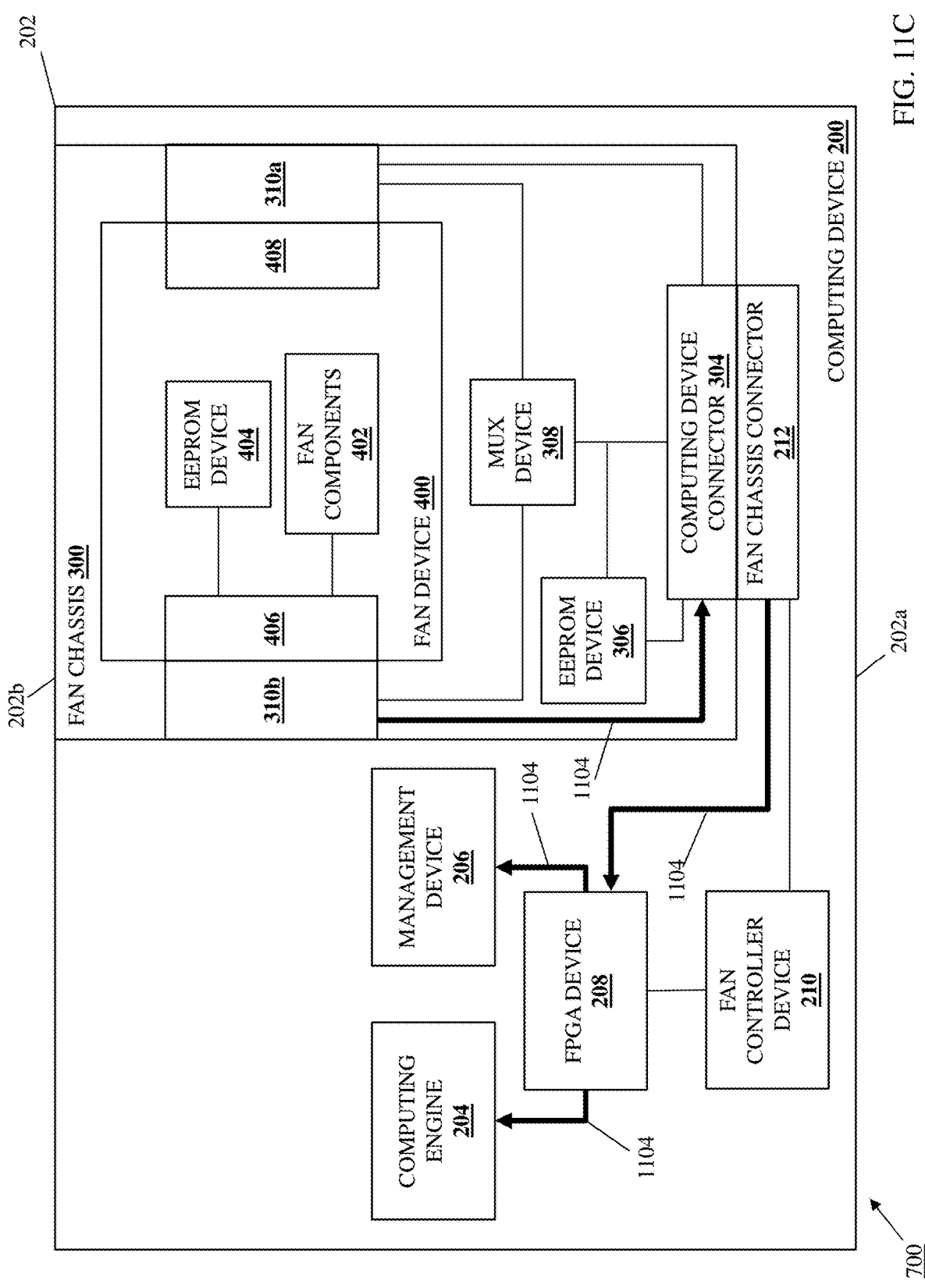
FIG. 11C is a schematic view illustrating an embodiment of the computing device, fan chassis, and fan device of FIG. 9 operating during the method of FIG. 5.
Figure 11D:
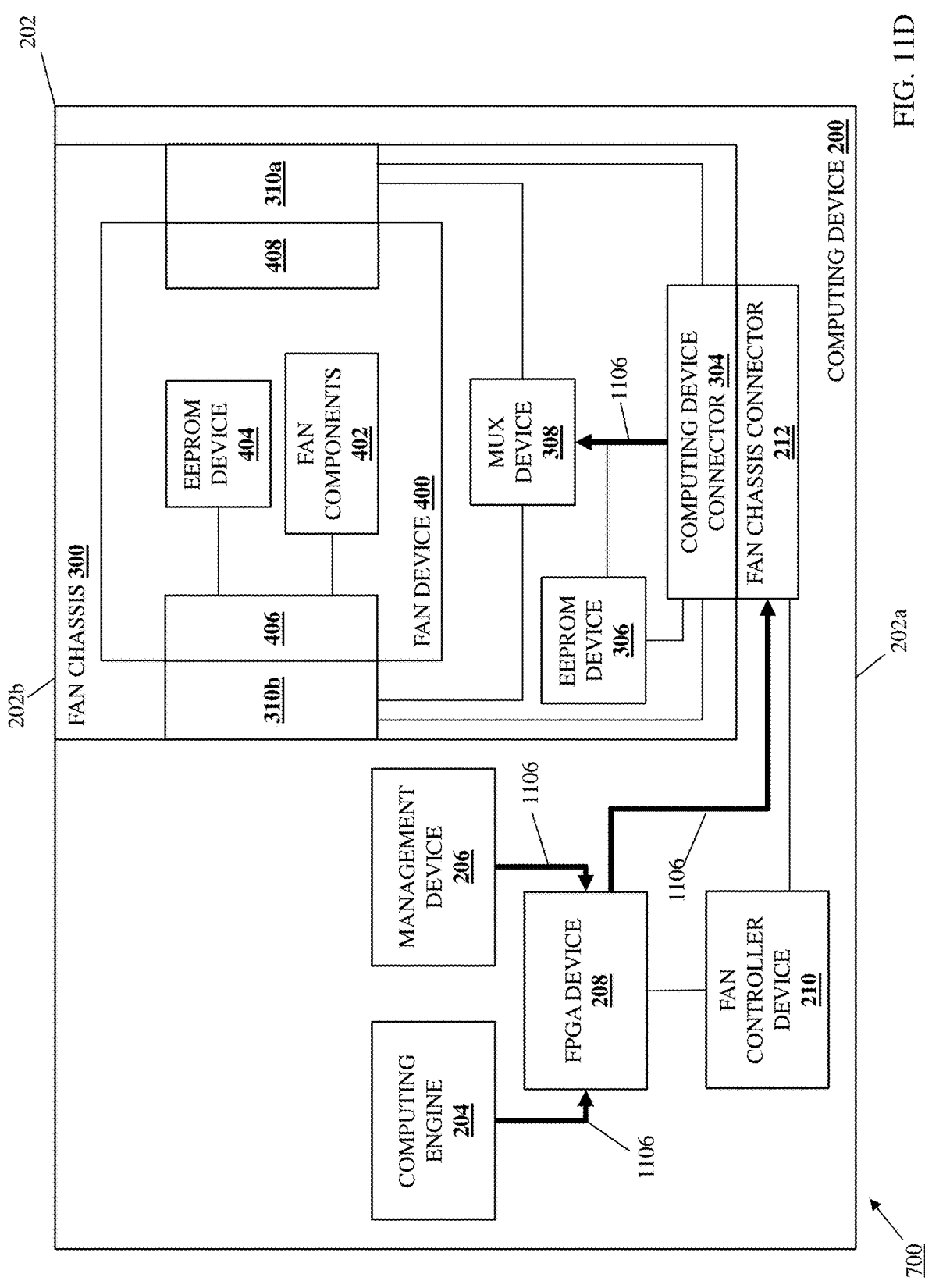
FIG. 11D is a schematic view illustrating an embodiment of the computing device, fan chassis, and fan device of FIG. 9 operating during the method of FIG. 5.

With reference to FIG. 11B, in response to receiving the interrupt, the computing engine 204 or the management device 206 may perform fan chassis EEPROM device access operations 1102 that may include accessing the EEPROM device 306 in the fan chassis 300 (which may be visible via an I2C bus in the fan chassis 300) in order to retrieve, for example, an identifier for the fan chassis 300 (e.g., an SKU for the fan chassis 300 that identifies its manufacturer), the configurable airflow direction fan capabilities of the fan chassis 300, and/or any other information that would be apparent to one of skill in the art in possession of the present disclosure. Furthermore, as discussed above, in some examples the fan chassis connector 406 on the fan device 400 may be configured to short circuit the GND coupling and the forward airflow detect coupling to the reverse airflow direction fan device connector 310b (e.g., via the first two connector elements (also called "pins") on the fan chassis connector 406), which may cause the fan system 1000 to perform reverse airflow direction identification operations 1104 that "drive" a reverse airflow detect signal that is transmitted via the computing device connector 304 and the fan chassis connector 212 to "low" value (e.g., via a "pull-up" resistor, not illustrated), allowing the computing engine 204 or the management device 206 to identify that the fan device 400 is oriented in the reverse airflow direction orientation.

However, one of skill in the art in possession of the present disclosure will appreciate how the computing engine 204 or the management device 206 may identify that the fan device 400 is oriented in the reverse airflow direction orientation via a reverse airflow detect presence signal that may be transmitted via the fan module presence signal coupling in the computing device 200 as part of the interrupt. As such, one of skill in the art in possession of the present disclosure will appreciate how the reverse airflow direction orientation of the fan device 400 illustrated in FIG. 7 may be detected in a variety of manners that will fall within the scope of the present disclosure as well.

Following the identification that the fan device 400 is oriented in the reverse airflow direction orientation, the computing engine 204 or the management device 206 may perform multiplexer configuration operations 1106 that may include activating the multiplexer device 308 by generating and transmitting an EN signal via the EN signal coupling between the computing device connector 304 and the multiplexer device 308 in the fan chassis 300, which one of skill in the art in possession of the present disclosure will appreciate may cause the multiplexer device 308 to power on. Furthermore, the multiplexer configuration operations 1106 may also include the computing engine 204 or the management device 206 configuring the multiplexer device 308 to transmit fan control signals to the reverse airflow direction fan device connector 310b by, for example, generating and transmitting SEL signals via the SEL signal coupling between the computing device connector 304 and the multiplexer device 308 in the fan chassis 300.

Figure 11E:
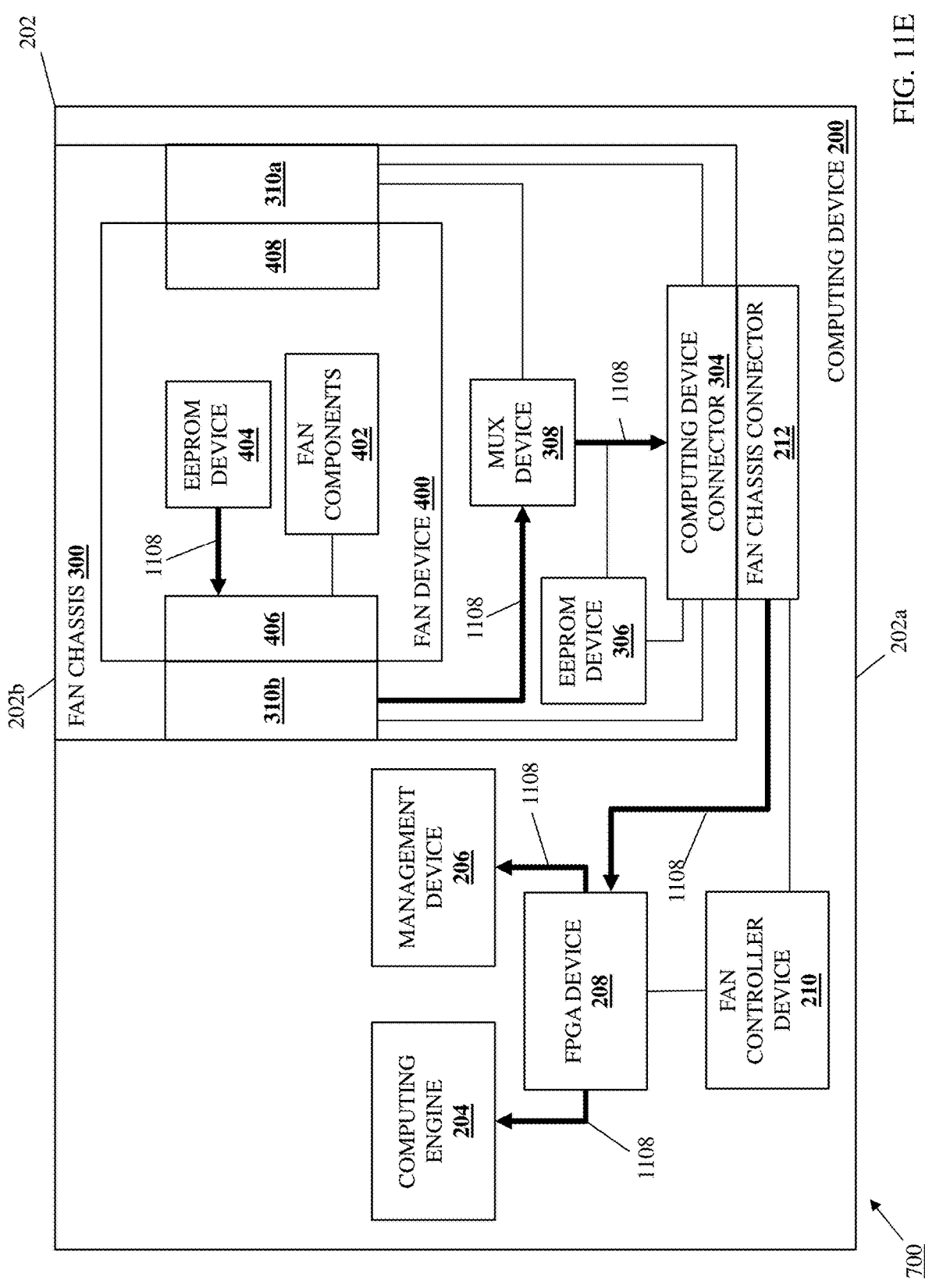
FIG. 11E is a schematic view illustrating an embodiment of the computing device, fan chassis, and fan device of FIG. 9 operating during the method of FIG. 5.

With reference to FIG. 11E, following the configuration of the multiplexer device 308, the computing engine 204 or the management device 206 may perform fan device EEPROM device access operations 1108 that may include accessing the EEPROM device 404 in the fan device 400 (which may be visible via an I2C bus in the fan chassis 300) via the multiplexer device 308 and the reverse airflow direction fan device connector 310b configured as discussed above, and may retrieve fan device capability information such as, for example, an identifier for the fan device 400 (e.g., a serial number of the fan device 400), fan device manufacturer information for the fan device 400, a part number for the fan device 400, a number of fans in the fan device 400, a maximum RPM supported by the fan device 400, alarms supported by the fan device 400, PWM characteristics of the fan device 400 (i.e., fan device driving information), TACH reading interpretation information for the fan device 400, and/or any other fan device information that would be apparent to one of skill in the art in possession of the present disclosure.

Figure 11F:
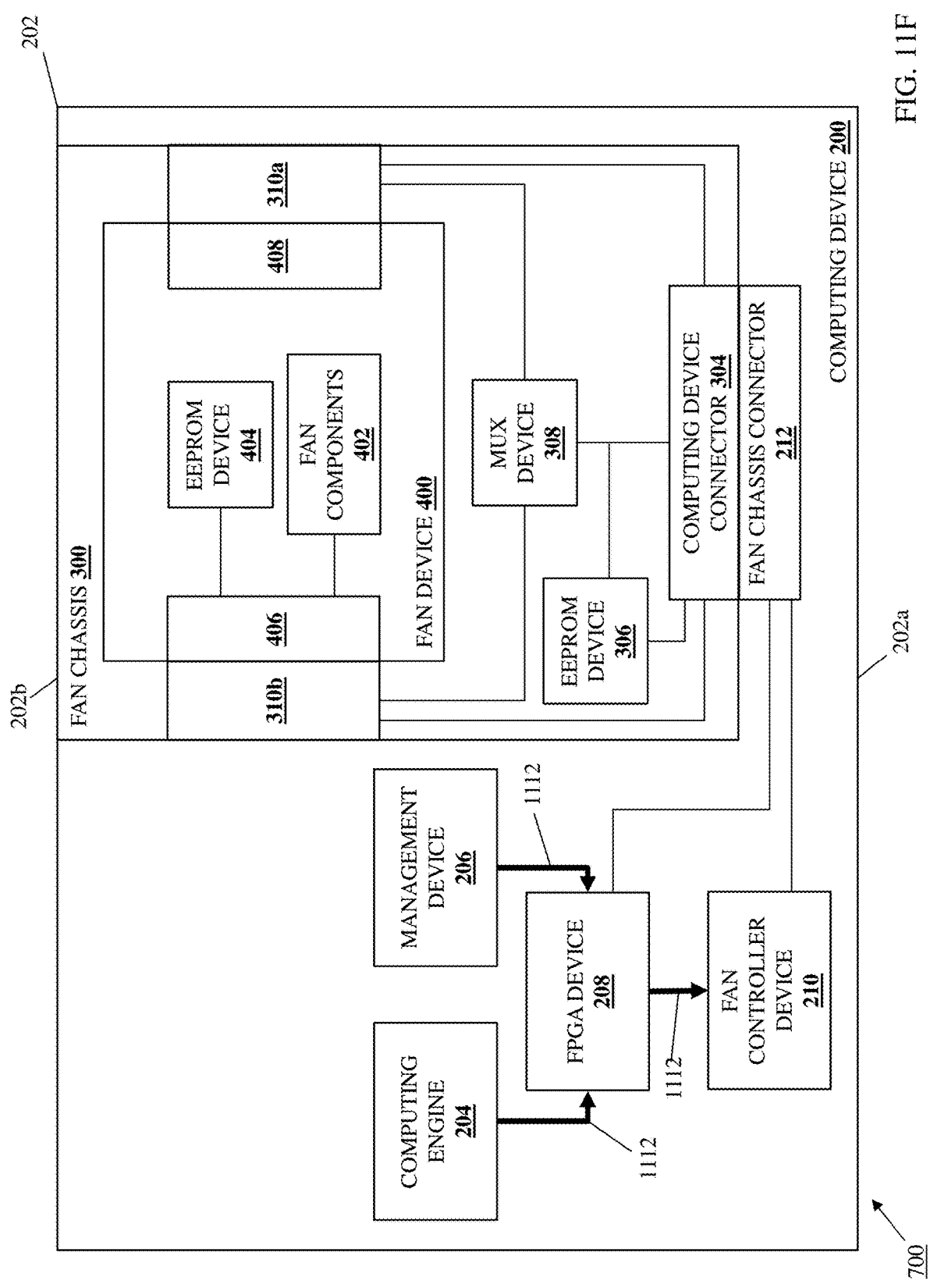
FIG. 11F is a schematic view illustrating an embodiment of the computing device, fan chassis, and fan device of FIG. 9 operating during the method of FIG. 5.
Figure 11G:
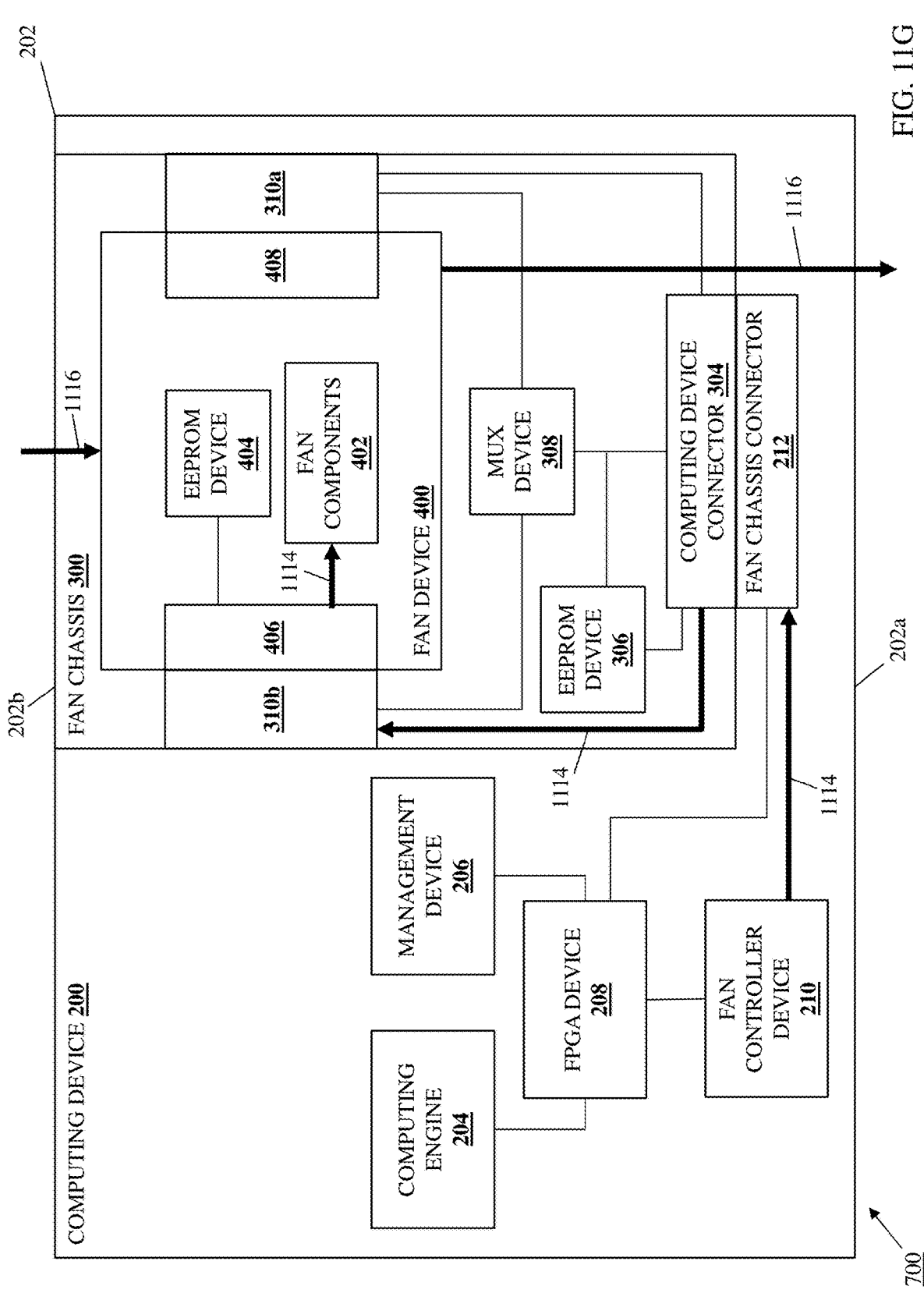
FIG. 11G is a schematic view illustrating an embodiment of the computing device, fan chassis, and fan device of FIG. 9 operating during the method of FIG. 5.

The method 500 then proceeds to block 514 where the computing device controls the fan device to produce airflow in a second direction. With reference to FIG. 11F, in an embodiment of block 514, the computing engine 204 or the management device 206 may perform fan controller programming operations 1112 that may include programming the fan controller device 210 to control the operation of the fan device 400 using any of the information retrieved at block 512 discussed above and any of a variety of fan controller programming techniques that would be apparent to one of skill in the art in possession of the present disclosure. With reference to FIG. 11G, in an embodiment of block 514 and following the programming of the fan controller device 210, the fan controller device 210 may perform fan control operations 1114 that may include controlling the operation of the fan device 400, which as described above will cause the fan device 400 to produce an airflow 1116 in the computing device in a reverse airflow direction (e.g., via airflow apertures defined on the rear surface 202b of the chassis 202 of the computing device 200, through the computing device 200, and out of airflow apertures defined on the front surface 202a of the chassis 202 of the computing device 200).

Thus, systems and methods have been described that provide a fan chassis that is configured to connect to a computing device, as well as to receive a fan device in either a first airflow direction orientation that allows the fan device to produce an airflow in a first direction relative to the fan chassis, or a second airflow direction orientation that allows the fan device to produce the airflow in a second direction relative to the fan chassis that is opposite the first direction. For example, the configurable airflow direction fan system of the present disclosure may include a fan device with a fan chassis connector, and a fan chassis that connects to a computing device. A first airflow direction fan device connector on the fan chassis connects to the fan chassis connector on the fan device when the fan device is mounted to the fan chassis in a first airflow direction orientation that will produce a first direction airflow in the computing device when the fan chassis is positioned in the computing device. A second airflow direction fan device connector on the fan chassis connects to the fan chassis connector on the fan device when the fan device is mounted to the fan chassis in the second airflow direction orientation that will produce a second direction airflow in the computing device that is different than the first direction airflow when the fan chassis is positioned in the computing device. As such, the airflow produced by fan devices in a computing device is configured to be provided in multiple different directions without the limitations of conventional "reversible" fan systems.

Although illustrative embodiments have been shown and described, a wide range of modification, change and substitution is contemplated in the foregoing disclosure and in some instances, some features of the embodiments may be employed without a corresponding use of other features.

Accordingly, it is appropriate that the appended claims be construed broadly and in a manner consistent with the scope of the embodiments disclosed herein.

What is claimed is:

1. A configurable airflow direction fan system, comprising:
  a fan device that includes a fan chassis connector; and
  a fan chassis that is configured to be positioned in a computing device and that includes:
    a computing device connector that is configured to connect to the computing device when the fan chassis is positioned in the computing device;
    a fan device mounting subsystem that is configured to mount the fan device to the fan chassis in either:
      a first airflow direction orientation that orients the fan device to produce a first airflow in a first direction in the computing device when the fan chassis is positioned in the computing device; or
      a second airflow direction orientation that orients the fan device to produce a second airflow in a second direction in the computing device that is different than the first direction when the fan chassis is positioned in the computing device;
    a first airflow direction fan device connector that is coupled to the computing device connector and that is configured to connect to the fan chassis connector on the fan device when the fan device is mounted to the fan chassis in the first airflow direction orientation; and
    a second airflow direction fan device connector that is coupled to the computing device connector and that is configured to connect to the fan chassis connector on the fan device when the fan device is mounted to the fan chassis in the second airflow direction orientation.

2. The system of claim 1, wherein the second direction of the second airflow is opposite the first direction of the first airflow.

3. The system of claim 1, wherein the fan chassis includes:
  a multiplexer device that is coupled to each of the first airflow direction fan device connector and the second airflow direction fan device connector, wherein the multiplexer device is configurable to:
    forward fan device commands received from the computing device to the first airflow direction fan device connector when the computing device connector is connected to the computing device, and the fan device is mounted to the fan chassis in the first airflow direction orientation and connected to the first airflow direction fan device connector; or
    forward fan device commands received from the computing device to the second airflow direction fan device connector when the computing device connector is connected to the computing device, and the fan device is mounted to the fan chassis in the second airflow direction orientation and connected to the second airflow direction fan device connector.

4. The system of claim 3, wherein the fan chassis includes:
  a memory device that is connected to the computing device connector and that stores configurable airflow direction fan system identification information that is accessible to the computing device when the computing device connector is connected to the computing device to identify that fan devices may be mounted in the fan chassis in either the first airflow direction orientation or the second airflow direction orientation, and that is configured to cause the computing device to configure the multiplexer device to forward fan device commands to the first airflow direction fan device connector or the second airflow direction fan device connector.

5. The system of claim 4, wherein the configurable airflow direction fan system identification information causes the computing device to identify a shorted connecter on one of the first airflow direction fan device connector or the second airflow direction fan device connector and, in response, configure the multiplexer device to forward fan device commands to that airflow direction fan device connector.

6. The system of claim 3, wherein the multiplexer device is configurable to forward fan device commands to the first airflow direction fan device connector in response to the computing device connector being connected to the computing device with the fan device connected to the first airflow direction fan device connector, and to forward fan device commands to the second airflow direction fan device connector in response to the computing device connector being connected to the computing device with the fan device connected to the second airflow direction fan device connector.

7. The system of claim 1, wherein the fan device includes:
  a dummy connector that is configured to:
    connect to the second airflow direction fan device connector when the fan device is mounted to the fan chassis in the first airflow direction orientation with the fan chassis connector connected to the first airflow direction fan device connector; and
    connect to the first airflow direction fan device connector when the fan device is mounted to the fan chassis in the second airflow direction orientation with the fan chassis connector connected to the second airflow direction fan device connector.

8. A fan chassis, comprising:
  a computing device connector that is configured to connect to a computing device when the fan chassis is positioned in the computing device;
  a fan device mounting subsystem that is configured to mount a fan device to the fan chassis in either:
    a first airflow direction orientation that orients the fan device to produce a first airflow in a first direction in the computing device when the fan chassis is positioned in the computing device; or
    a second airflow direction orientation that orients the fan device to produce a second airflow in a second direction in the computing device that is different than the first direction when the fan chassis is positioned in the computing device;
  a first airflow direction fan device connector that is coupled to the computing device connector and that is configured to connect to a fan chassis connector on the fan device when the fan device is mounted to the fan chassis in the first airflow direction orientation; and
  a second airflow direction fan device connector that is coupled to the computing device connector and that is configured to connect to the fan chassis connector on the fan device when the fan device is mounted to the fan chassis in the second airflow direction orientation.

9. The fan chassis of claim 8, wherein the second direction of the second airflow is opposite the first direction of the first airflow.

10. The fan chassis of claim 8, further comprising:
  a multiplexer device that is coupled to each of the first airflow direction fan device connector and the second airflow direction fan device connector, wherein the multiplexer device is configurable to:

forward fan device commands received from the computing device to the first airflow direction fan device connector when the computing device connector is connected to the computing device, and the fan device is mounted to the fan chassis in the first airflow direction orientation and connected to the first airflow direction fan device connector; or forward fan device commands received from the computing device to the second airflow direction fan device connector when the computing device connector is connected to the computing device, and the fan device is mounted to the fan chassis in the second airflow direction orientation and connected to the second airflow direction fan device connector.

11. The fan chassis of claim 10, further comprising:

a memory device that is connected to the computing device connector and that stores configurable airflow direction fan system identification information that is accessible to the computing device when the computing device connector is connected to the computing device to identify that fan devices may be mounted in the fan chassis in either the first airflow direction orientation or the second airflow direction orientation, and that is configured to cause the computing device to configure the multiplexer device to forward fan device commands to the first airflow direction fan device connector or the second airflow direction fan device connector.

12. The fan chassis of claim 11, wherein the configurable airflow direction fan system identification information causes the computing device to identify a shorted connecter on one of the first airflow direction fan device connector or the second airflow direction fan device connector and, in response, configure the multiplexer device to forward fan device commands to that airflow direction fan device connector.

13. The fan chassis of claim 10, wherein the multiplexer device is configurable to forward fan device commands to the first airflow direction fan device connector in response to the computing device connector being connected to the computing device with the fan device connected to the first airflow direction fan device connector, and to forward fan device commands to the second airflow direction fan device connector in response to the computing device connector being connected to the computing device with the fan device connected to the second airflow direction fan device connector.

14. A method for configuring an airflow direction of a fan system, comprising:

mounting, by a fan device mounting subsystem in a fan chassis, a fan device in the fan chassis in a first airflow direction orientation to connect a fan chassis connector on the fan device to a first airflow direction fan device connector on the fan chassis;

connecting, by a computing device connector on the fan chassis that is coupled to the first airflow direction fan device connector and in response to the fan chassis being positioned in a computing device, to the computing device to allow the computing device to control the fan device to produce a first airflow in a first direction in the computing device due to the fan device being mounted in the first airflow direction orientation;

remounting, by the fan device mounting subsystem in the fan chassis, the fan device in the fan chassis from the first airflow direction orientation to a second airflow direction orientation to connect the fan chassis connector on the fan device to a second airflow direction fan device connector on the fan chassis; and connecting, by the computing device connector on the fan chassis that is coupled to the second airflow direction fan device connector and in response to the fan chassis being positioned in the computing device, to the computing device to allow the computing device to control the fan device to produce a second airflow in a second direction in the computing device that is different than the first direction due to the fan device being mounted in the second airflow direction orientation.

15. The method of claim 14, wherein the second direction of the second airflow is opposite the first direction of the first airflow.

16. The method of claim 14, further comprising:

forwarding, by a multiplexer device in the fan chassis that is coupled to each of the first airflow direction fan device connector and the second airflow direction fan device connector, fan device commands received from the computing device to the first airflow direction fan device connector when the computing device connector is connected to the computing device, and the fan device is mounted to the fan chassis in the first airflow direction orientation and connected to the first airflow direction fan device connector; or forwarding, by the multiplexer device, fan device commands received from the computing device to the second airflow direction fan device connector when the computing device connector is connected to the computing device, and the fan device is mounted to the fan chassis in the second airflow direction orientation and connected to the second airflow direction fan device connector.

17. The method of claim 16, further comprising:

accessing, by the computing device in a memory device in the fan chassis that is connected to the computing device connector, configurable airflow direction fan system identification information;

identifying, by the computing device based on the configurable airflow direction fan system identification information, that fan devices may be mounted in the fan chassis in either the first airflow direction orientation or the second airflow direction orientation; and configuring, by the computing device in response to identifying that fan devices may be mounted in the fan chassis in either the first airflow direction orientation or the second airflow direction orientation, the multiplexer device to forward fan device commands to the first airflow direction fan device connector or the second airflow direction fan device connector.

18. The method of claim 14, further comprising:

identifying, by the computing device in response to identifying that fan devices may be mounted in the fan chassis in either the first airflow direction orientation or the second airflow direction orientation, a shorted connecter on one of the first airflow direction fan device connector or the second airflow direction fan device connector and, in response, configuring the multiplexer device to forward fan device commands to that airflow direction fan device connector.

19. The method of claim 14, further comprising:

configuring, by the multiplexer device, the multiplexer device to forward fan device commands to the first airflow direction fan device connector in response to the computing device connector being connected to the computing device with the fan device connected to the first airflow direction fan device connector; and configuring, by the multiplexer device, the multiplexer device to forward fan device commands to the second airflow direction fan device connector in response to the computing device connector being connected to the computing device with the fan device connected to the second airflow direction fan device connector.

20. The method of claim 14, further comprising:

connecting, by a dummy connector that is included on the fan device, to the second airflow direction fan device connector when the fan device is mounted to the fan chassis in the first airflow direction orientation with the fan chassis connector connected to the first airflow direction fan device connector; and connecting, by the dummy connector that is included on the fan device, to the first airflow direction fan device connector when the fan device is mounted to the fan chassis in the second airflow direction orientation with the fan chassis connector connected to the second airflow direction fan device connector.

* * * * *